(12) United States Patent
Iwasakii et al.

(10) Patent No.: US 6,445,055 B2
(45) Date of Patent: Sep. 3, 2002

(54) SEMICONDUCTOR INTEGRATED CIRCUIT DEVICE AND MANUFACTURING METHOD THEREOF

(75) Inventors: Takayuki Iwasakii, Hitachi; Yusuke Takeuchi, Hachiouji; Yoshiaki Yuyama, Fussa; Shinichi Tanabe, Ome; Koki Sakai, Koganei; Minehiro Nemoto, Hitachi; Seigo Yukutake, Hitachinaka; Yasuyuki Kojima, Hitachi; Atsuo Watanabe, Hitachiota; Mitsuaki Horiuchi, Hachiouji, all of (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/924,588

(22) Filed: Aug. 9, 2001

(30) Foreign Application Priority Data

Aug. 14, 2000 (JP) ........................................ 2000-245737

(51) Int. Cl.⁷ ................................................ H01L 29/00
(52) U.S. Cl. ........................ 257/507; 257/532; 257/533; 257/536
(58) Field of Search ................................. 257/354, 374, 257/396, 397, 507, 532, 533, 536

(56) References Cited

U.S. PATENT DOCUMENTS 5,747,867 A * 5/1998 Oppermann ................ 257/507
5,977,606 A * 11/1999 Sakurai et al. .............. 257/507
6,376,296 B2 * 4/2002 Tung ........................... 438/221

FOREIGN PATENT DOCUMENTS

JP          11-317445          11/1999

* cited by examiner

Primary Examiner—Ngân V. Ngô
(74) Attorney, Agent, or Firm—Mattingly, Stanger & Malur, P.C.

(57) ABSTRACT

A circuit region 2 on a main surface of an SOI substrate, and a isolating region 9b defined by insulating isolation trenches 4a and 4b are connected by a wiring resistor, or a diffused resistor 11a in the SOI substrate. The isolating region 9b and an intermediate region 9 are connected by a wiring resistor, or a diffused resistor 11b in the SOI substrate. Furthermore, a circuit region 3 on a main surface of an SOI substrate, and a isolating region 9c defined by insulating isolation trenches 4c and 4d are connected by a wiring resistor, or a diffused resistor 11d in the SOI substrate. The isolating region 9c and an intermediate region 9 are connected by a wiring resistor, or a diffused resistor 11c in the SOI substrate. As a result, distribution of voltage applied between the circuit regions 2 and 3 by the wiring resistors or the diffused resistors 11a to 11d can increase the withstand voltage of a semiconductor integrated circuit.

29 Claims, 27 Drawing Sheets

SEMICONDUCTOR INTEGRATED CIRCUIT DEVICE AND MANUFACTURING METHOD THEREOF

BACKGROUND OF THE INVENTION

The present invention relates to a semiconductor integrated circuit device and a manufacturing method thereof, and in particular to a technique that is effectively applicable to a high withstand voltage LSI (Large Scale Integrated Circuit) formed on a SOI (Silicon on Insulator) substrate.

The SOI substrate means a substrate having a silicon film formed on an insulating film. A high withstand voltage LSI such as a communication LSI or the like includes a plurality of semiconductor elements formed on the SOI substrate.

Furthermore, this plurality of semiconductor elements are formed on an island region separated by trenches in which an insulating film is embedded For example, Japanese Patent Laid-open No. 11-317445 discloses such a semiconductor device that a circuit region is surrounded several times over by a trench insulating film to achieve a high withstand voltage characteristic.

In this way, it is possible to achieve increase in the withstand voltage by covering the above-mentioned island region with trenches several times over.

SUMMARY OF THE INVENTION

However, as described later, the present inventors have recognized that there is a limit in increasing the withstand voltage by using such the method.

An object of the present invention relating to a semiconductor integrated circuit device and a manufacturing method thereof is to provide a semiconductor integrated circuit device having a high withstand voltage and a manufacturing method of the same.

Another object of the present invention is to provide a semiconductor integrated circuit device having a high withstand voltage and a manufacturing method of the same and thereby improve the reliability of the semiconductor integrated circuit device.

The above-mentioned objects and novel features of the present invention will become apparent to description of the present specification and accompanying drawings.

Of inventions disclosed in the present application, representative inventions will be briefly described as follows.

A semiconductor integrated circuit device according to the present invention has a first and second circuit regions on a main surface of an SOI substrate and includes a first insulating isolation trench surrounding said first circuit region, a second insulating isolation trench surrounding this first insulating isolation trench, a third insulating isolation trench surrounding said second circuit region, and a fourth insulating isolation trench surrounding this third insulating isolation trench, and the first circuit region and a first isolating region defined by said first and second insulating isolation trenches are connected by a wiring resistor or a diffused resistor in the SOI substrate. Said first isolating region and an intermediate region extending between said second and fourth insulating isolation trenches are connected via a wiring resistor or a diffused resistor in the SOI substrate. Furthermore, said second circuit region and a second isolating region defined by said third and fourth insulating isolation trenches are connected via a wiring resistor or a diffused resistor in the SOI substrate, and the second isolating region and the intermediate region are connected via a wiring resistor or a diffused resistor in the SOI substrate.

According to the above-mentioned means, since the voltage generated by the wiring resistors or the diffused resistors is distributed, each voltage applied to the insulating isolation trenches can be made uniform. Therefore, the withstand voltage of the first and second circuit regions can be increased.

Furthermore, if said first and second circuit regions are surrounded by wide insulating isolation trenches, the withstand voltage of the first and second circuit regions can be increased.

Furthermore, if said first and second circuit regions are connected via a capacitance element, it is possible to transmit only electric signals during maintenance of the insulation states of the first and second circuit regions.

A manufacturing method of a semiconductor integrated circuit device according to the present invention comprises the steps of: etching a semiconductor region constituting an SOI substrate until an insulating layer is exposed, and thereby forming a first isolation groove surrounding a first circuit region on the semiconductor region, a second isolation groove surrounding said first isolation groove, a third isolation groove surrounding a second circuit region, and a fourth isolation groove surrounding said third isolation groove; depositing a silicon oxide film on the semiconductor region in addition to insides of said first to fourth isolation grooves; removing the silicon oxide film located outside the first to fourth isolation grooves, and thereby forming a first to fourth insulating isolation trenches formed of the silicon oxide film embedded in said first to fourth isolation grooves; forming respectively a first to fourth wiring resistors on the first to fourth insulating isolation trenches; and forming a wiring for connecting, via the first to fourth wiring resistors, both said first or second circuit region and an intermediate region located between said second and fourth insulating isolation trenches.

Furthermore, a manufacturing method of a semiconductor integrated circuit device according to the present invention further comprises a step of forming a stopper film on a silicon oxide film located on each of said isolation grooves.

According to the above-mentioned means, it is possible to form a semiconductor integrated circuit device having a high withstand voltage.

DESCRIPTION OF THE PREFERRED EMBODIMENTS

Figure 1:
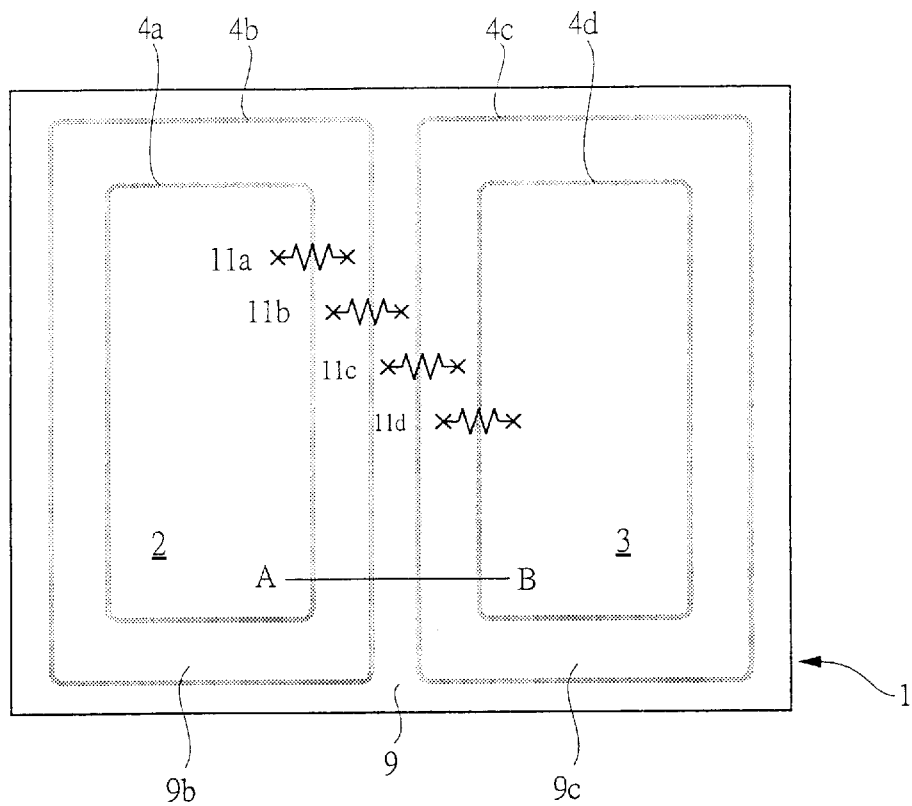
FIG. 1 is a top view of a principal part of a substrate showing a semiconductor integrated circuit device that is a first embodiment of the present invention.

Hereinafter, embodiments of the present invention will be described in detail by referring to the drawings. Throughout the drawings showing the embodiments, members having the same function are denoted by the same reference number, and repeated description thereof will be omitted.

First Embodiment

Figure 2:
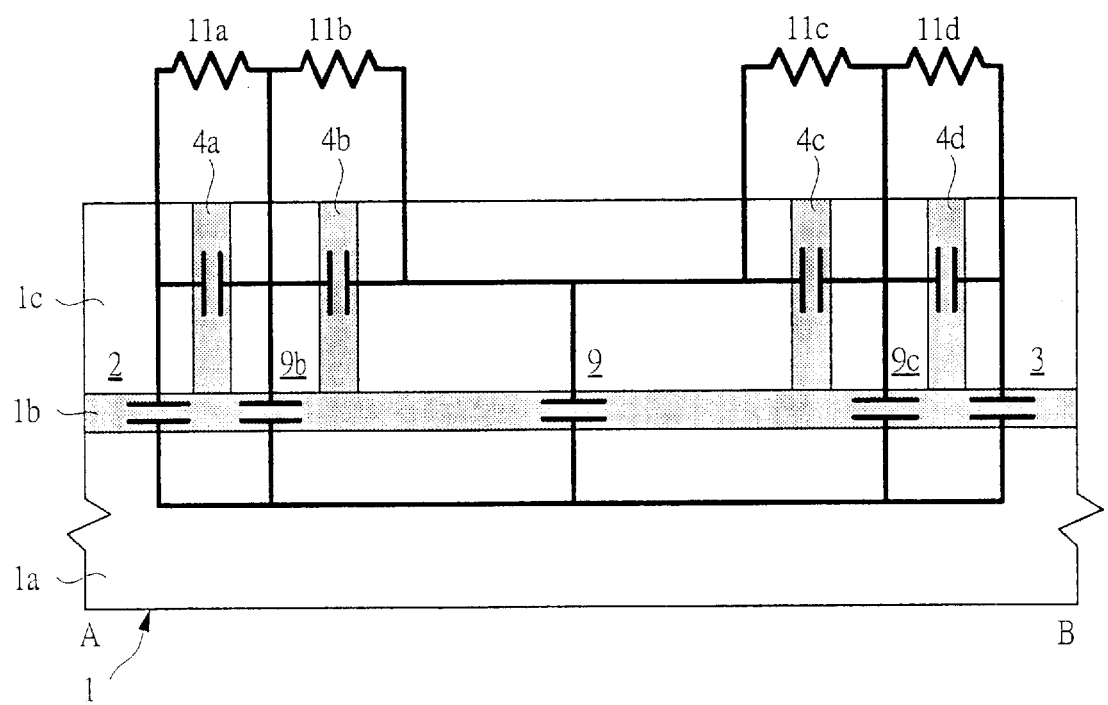
FIG. 2 is a cross-sectional view of a principal part of a substrate showing a semiconductor integrated circuit device that is a first embodiment of the present invention.

FIG. 1 is a top view of a principal part of a semiconductor integrated circuit device that is a first embodiment of the present invention. FIG. 2 is a cross-sectional view taken along line A-B of FIG. 1. Equivalent circuits corresponding to respective portions also shown in FIG. 2 (and even in FIGS. 4, 5, 12, 14, 16, 17 and 19 as described later).

As shown in FIGS. 1 and 2, circuit regions 2 (corresponding to a first circuit region) and 3 (corresponding to a second circuit region) are formed on a main surface of an SOI substrate 1. The SOI substrate comprises a supporting layer 1a made of polycrystalline silicon or the like, an insulating layer 1b, and a semiconductor region 1c made of monocrystalline silicon or the like. The supporting layer 1a has a thickness of, for example, 500 $\mu$m. The insulating layer 1b has a thickness of, for example, 3 $\mu$m.

The circuit regions 2 and 3 are respectively surrounded by insulating isolation trenches 4a (corresponding to a first insulating isolation trench) and 4d (corresponding to a third insulating isolation trench) which arrive at the insulating layer 1b, and thereby become island regions. In addition, the circuit regions 2 and 3 are respectively located outside the insulating isolation trenches 4a and 4d, and surrounded by insulating isolation trenches 4b (corresponding to a second insulating isolation trench) and 4c (corresponding to a fourth insulating isolation trench) which arrive at the insulating layer 1b, and electrically separated from other regions (9, 9b and 9c). The insulating isolation trenches 4a to 4d are formed in order to increase each withstand voltage of the circuit regions 2 and 3. Each of the insulating isolation trenches 4a to 4d has a width, for example, of approximately 0.4 μm and a depth, for example, of approximately 2 μm.

An region between the outermost insulating isolation trenches (corresponding to reference numbers 4b and 4c in this case) which surround the circuit regions 2 and 3 is referred to as an intermediate region 9. An region between the insulating isolation trenches 4a and 4b is referred to as an intermediate region 9b (corresponding to a first isolating region). An region between the insulating isolation trenches 4c and 4d is referred to as an intermediate region 9c (corresponding to a second isolating region). The intermediate region 9 also includes the outside region of the outermost insulating isolation trench (corresponding to reference number 4b in this case) which surrounds the circuit region 2, and the outside region of the outermost insulating isolation trench (corresponding to reference number 4c in this case) which surrounds the circuit region 3.

A resistor 11a is connected between the circuit region 2 and the isolating region 9b. A resistor 11b is connected between the isolating region 9b and the intermediate region 9. Furthermore, a resistor 11d is connected between the circuit region 3 and the isolating region 9c. A resistor 11c is connected between the isolating region 9c and the intermediate region 9. In other words, the resistors 11a and 11b are connected in parallel with the insulating isolation trenches 4a and 4b between the circuit region 2 and the intermediate region 9, respectively. Also, the resistors 11c and 11d are connected in parallel with the insulating isolation trenches 4c and 4d between the circuit region 3 and the intermediate region 9, respectively.

In the present embodiment, since the resistors 11a to 11d are thus formed between the respective inside and outside regions of the insulating isolation trenches 4a to 4c, withstand voltage generated between the circuit regions 2 and 3 can be increased. Furthermore, the circuit region 2 and the isolating region 9b, the isolating region 9b and the intermediate region 9, the intermediate region 9 and the isolating region 9c, and the isolating region 9c and the circuit region 3 are connected via the resistors 11a to 11d, respectively. Therefore, these regions do not become a floating state, and it is possible to prevent electric charge such as surge from being stored in these regions (the circuit region 2, the isolating region 9b, the intermediate region 9, the isolating region 9c, and the circuit region 3).

Figure 3:
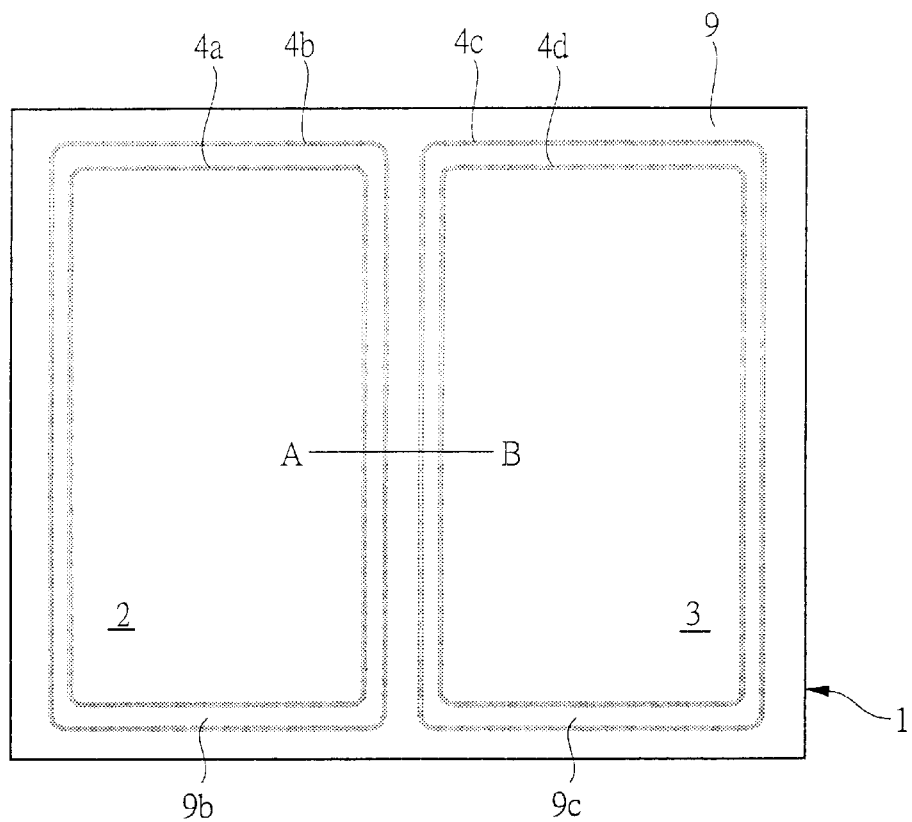
FIG. 3 is a top view of a principal part of a substrate for showing effects of the present invention.
Figure 4:
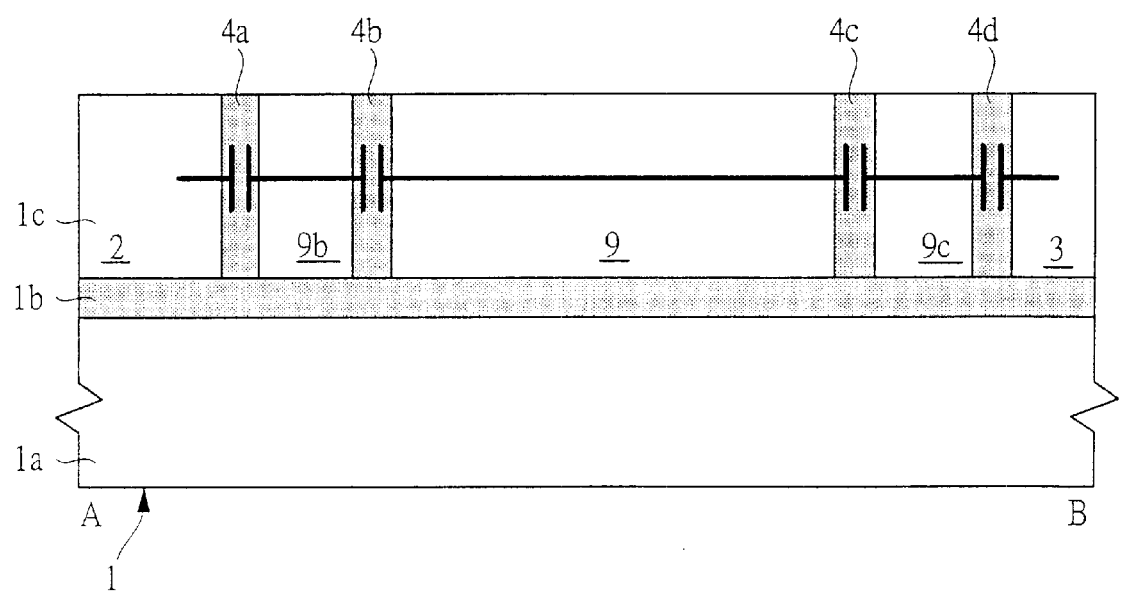
FIG. 4 is a cross-sectional view of a principal part of a substrate for showing effects of the present invention.

Next, the reason why the withstand voltage is increased by the above-mentioned resistors 11a to 11d will be described by referring to FIGS. 3 to 7. FIG. 3 is a top view showing a SOI substrate on which the resistors 11a to 11d are not formed. FIG. 4 is a cross-sectional view taken along line A-B of FIG. 3.

As described above, the insulating isolation trenches 4a to 4d are formed in order to increase the withstand voltage between the circuit regions 2 and 3. If a rated voltage per trench relative to the insulating isolation trenches 4a to 4d is 100 V, it seems that a withstand voltage of 400 V between the circuit regions 2 and 3 is obtained because four insulating isolation trenches (4a to 4d) are formed between the circuit regions 2 and 3. In order to increase further the withstand voltage, for example, in the case where six insulating isolation trenches are formed between the circuit regions 2 and 3, it seems that a withstand voltage of 600 V is obtained. In other words, as shown in FIG. 4, it seems that the insulating isolation trenches 4a to 4d are connected in series between the circuit regions 2 and 3, and the withstand voltage between the circuit regions 2 and 3 increases in proportion to the number of the insulating isolation trenches connected in series (see (a) of FIG. 7).

The present inventors have, further, been studied the relationship between the number of the insulating isolation trenches connected in series and the withstand voltage generated between the circuit regions 2 and 3, and arrived at following conclusions.

Figure 5:
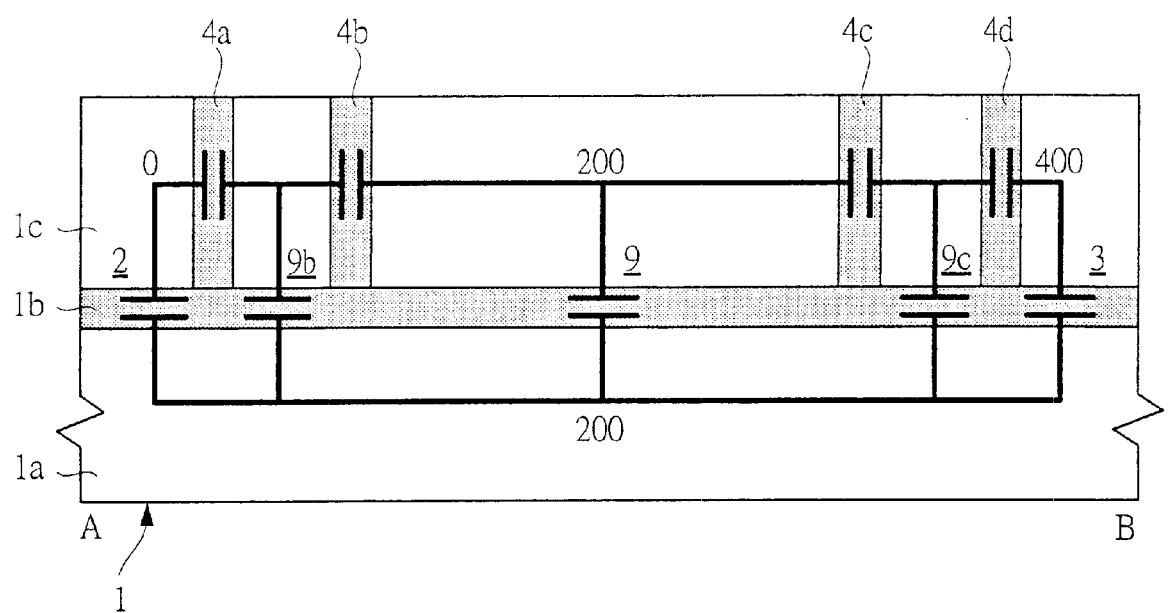
FIG. 5 is a cross-sectional view of a principal part of a substrate for showing effects of the present invention.

In the case of FIG. 4 described above, the insulating isolation trenches 4a to 4d are connected in series between the circuit regions 2 and 3, but the insulating isolation trenches 4a to 4d are in contact with the insulating layer 1b constituting the SOI substrate 1. Therefore, as shown in FIG. 5, it seems that an actually equivalent circuit diagram has capacitance of the insulating layer 1b added between one end of each capacitance of the insulating isolation trenches 4a to 4d and the supporting layer 1a. In such a case, for example, if a voltage of 400 V is applied between locations A and B, potential of the intermediate region 9 which is an intermediate portion located between the locations A and B becomes 200 V, and an intermediate portion of the supporting layer 1a also becomes 200 V. At the location B, therefore, a potential difference of 200 V (=400−200) is created. Even at the location A, a potential difference of 200 V (=200−0) is created. Accordingly, an overvoltage of at least 100 V is applied to the insulating isolation trenches (4a, 4d) and the insulating layer 1b located near the locations A and B. As a result, respective withstand voltages of the insulating isolation trenches (4a, 4d) and the insulating layer 1b decrease.

Figure 6:
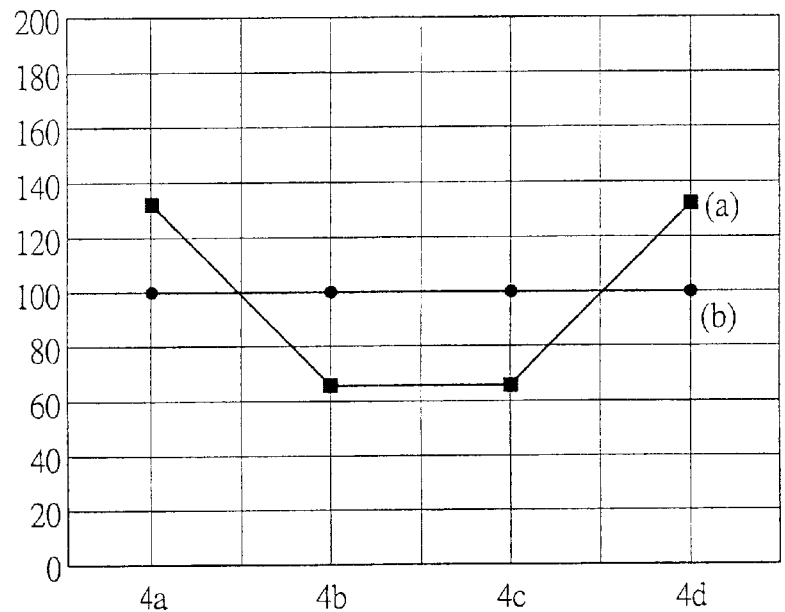
FIG. 6 is a graph showing a voltage applied to an insulating isolation trench.
Figure 7:
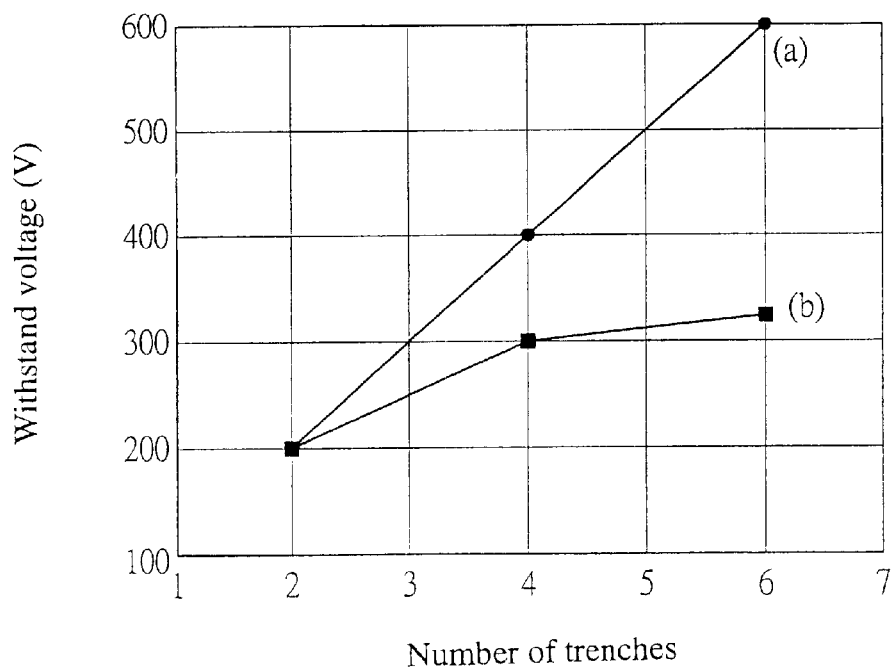
FIG. 7 is a graph showing a relationship between numbers of insulating isolation trenches and withstand voltages to indicate effects of the present invention.

A result of concrete simulation is shown in FIG. 6. For example, if a voltage of 400 V is applied between the locations A and B, the voltages applied to the insulating isolation trenches 4a to 4d do not become 100 V uniformly (see (b) of FIG. 6). The voltages applied to the insulating isolation trenches 4a and 4d become approximately 130 V. On the other hand, the voltages applied to the insulating isolation trenches 4b and 4c become approximately 70 V (see (a) of FIG. 6). In order to facilitate calculations, the insulating isolation trenches 4a to 4d and the insulating layer 1b of the SOI substrate have the same capacitance.

In this way, since a voltage of 100 V or more (overvoltage) is applied to the outermost insulating isolation trenches (4a, 4d), these insulating isolation trenches become apt to be damaged.

If the outermost insulating isolation trenches (4a, 4d) have been damaged, the insulating isolation trenches 4b and 4c substantially become outermost and these insulating isolation trenches thereby become apt to be damaged. In this case, the number of effective insulating isolation trenches also decreases, and consequently the overvoltage increases further. In this way, if the outermost insulating isolation trenches have been damaged, there is the drawback to damaging successively the inside insulating isolation trenches in an accelerative manner. Therefore, there is a limit in improving the withstand voltage by increasing the number of insulating isolation trenches, so that, as shown in (b) of FIG. 7, even if the number of insulating isolation trenches is increased, the withstand voltage does not increase in proportion to the number of insulating isolation trenches.

In the above-described present embodiment, however, the resistors 11a to 11d are formed between the inside and outside of each of the insulating isolation trenches 4a to 4d, so that the withstand voltage between the circuit regions 2 and 3 can be increased. That is, the withstand voltage between the circuit regions 2 and 3 can be increased in proportion to the number of the insulating isolation trenches connected in series as shown in (a) of FIG. 7.

This is because since the voltages are distributed by the resistors, it is possible to uniform the voltages applied to the insulating isolation trenches.

Figure 8:
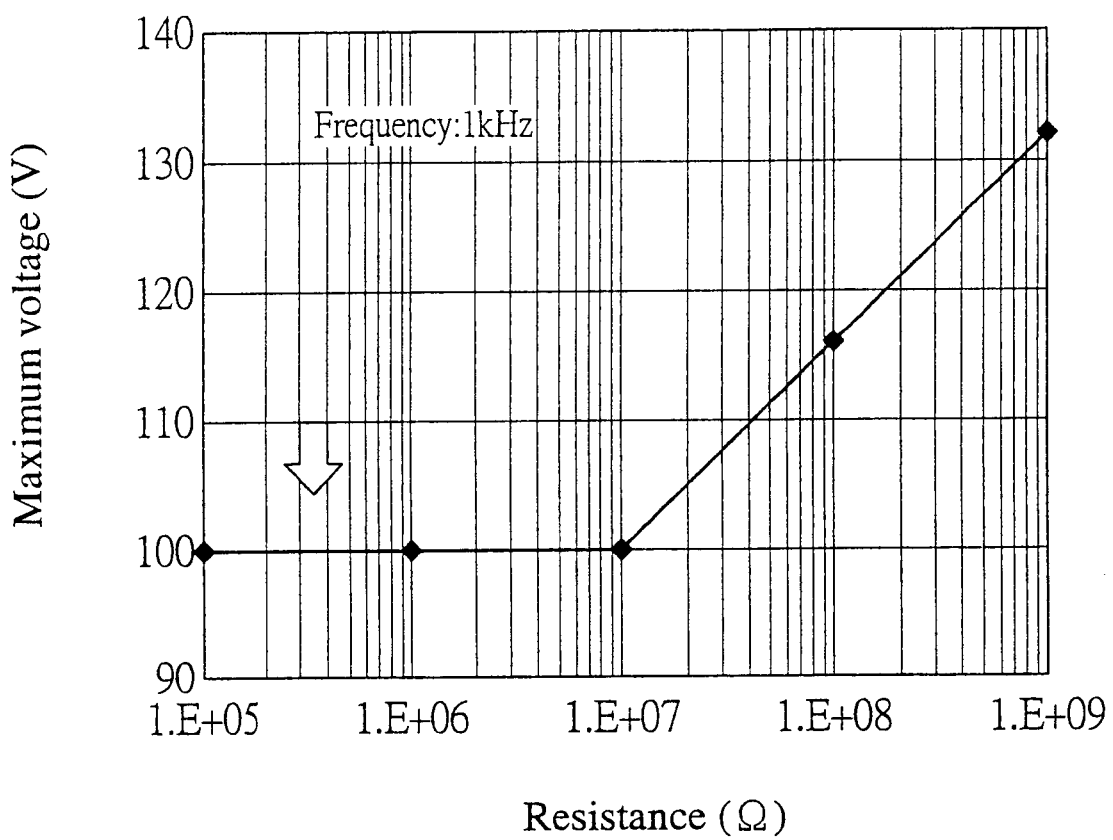
FIG. 8 is a graph showing a relationship between resistances and maximum voltages applied to insulating isolation trenches in the present invention.

Next, a result of study of the resistance value will be described. FIG. 8 is a graph showing the relationship between maximum value (V) of the voltage applied to the outermost insulating isolation trenches and resistance ($\Omega$) in the case where the four insulating isolation trenches (4a to 4d) are connected in series (FIG. 2), and an AC voltage of 400 V and a frequency of 1 kHz are applied between the circuit regions 2 and 3. In the case where the resistance value is greater (for example, $1\times10^9\Omega$), a voltage share depending on capacitors (corresponding to reference number 4a to 4d and 1b) becomes predominant, and eventually the maximum voltage becomes more than 130 V as shown in FIG. 8. On the contrary, in the case where the resistance value is small (for example, $1\times10^6\Omega$ a voltage share depending on the resistors (11a to 11d) becomes predominant, and the maximum voltage can be limited to 100 V or less.

Therefore, in order to make the maximum voltage 110 V or less, it is necessary to make the resistance value $4\times10^7\Omega$ or less.

Figure 9:
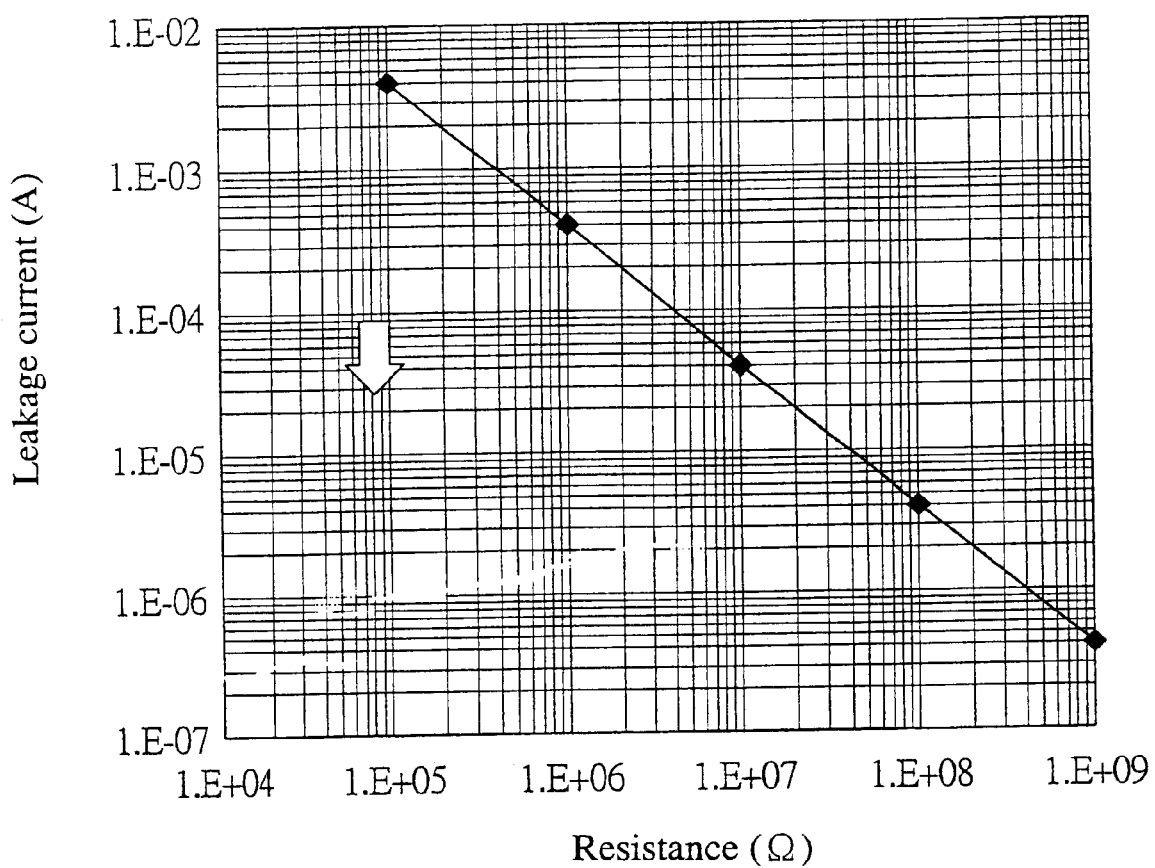
FIG. 9 is a graph showing a relationship between resistance and leakage current in the present invention.

However, if the resistance value becomes too small, there occurs the problem of a large leakage current between the circuit regions 2 and 3. FIG. 9 is a graph showing the relationship between leakage current (A) flowing between the circuit regions 2 and 3 and resistance ($\Omega$) in the case where the four insulating isolation trenches (4a to 4d) are connected in series (FIG. 2) and a DC voltage of 400 V is applied between the circuit regions 2 and 3. As the resistance decreases, the leakage current increases as shown in FIG. 9.

Therefore, for example, in order to make the leakage current $1\times10^{-4}$ or less, it is necessary to make the resistance $4\times10^6\Omega$ or more.

Second Embodiment

Figure 10:
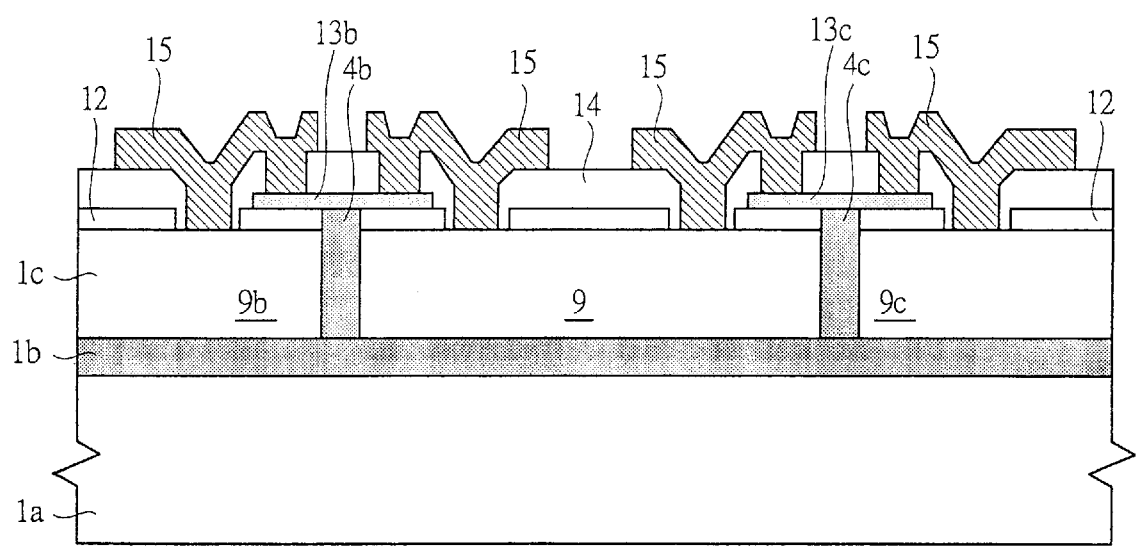
FIG. 10 is a cross-sectional view of a principal part of a substrate showing a semiconductor integrated circuit device that is a second embodiment of the present invention.

FIG. 10 is a cross-sectional view of a principal part of a semiconductor integrated circuit device that is a second embodiment of the present invention. In the present embodiment, the respective resistors 11a to 11d provided between the inside and outside of each of the insulating isolation trenches 4a to 4d connected in series and shown in FIG. 2 are implemented by using wiring resistors (corresponding to a first to fourth wiring resistors and resistor elements).

That is, wiring resistors 13b and 13c made of polysilicon or the like are formed on the insulating isolation trench 4b and 4c as shown in FIG. 10, respectively. The wiring resistor 13c is connected to the isolating region 9c via a first layer wiring 15 made of aluminum or the like. The wiring resistor 13c is also connected to the intermediate region 9c via the first layer wiring 15. In the same way, the wiring resistor 13b is connected to the isolating region 9b via the first layer wiring 15 made of aluminum or the like. The wiring resistor 13b is also connected to the intermediate region 9 via the first layer wiring 15.

Numeral 12 denotes a field oxide film, and numeral 14 denotes an interlayer insulating film made of a silicon oxide film or the like. The field oxide film 12 is used to isolate elements formed in the circuit regions. It is also possible that the field oxide film 12 is not formed on the insulating isolation trenches 4a to 4d and the wiring resistor 13b may be formed directly on the isolating region 9b, the insulating isolation trench 4b and the intermediate region 9. Furthermore, the wiring resistor 13c may be formed directly on the isolating region 9c, the insulating isolation trench 4c and the intermediate region 9.

According to the present embodiment, the resistors provided between the inside and outside of each of the insulating isolation trenches connected in series, are thus implemented by using the wiring resistors. As a result, high performance resistors can be formed.

Third Embodiment

Figure 11:
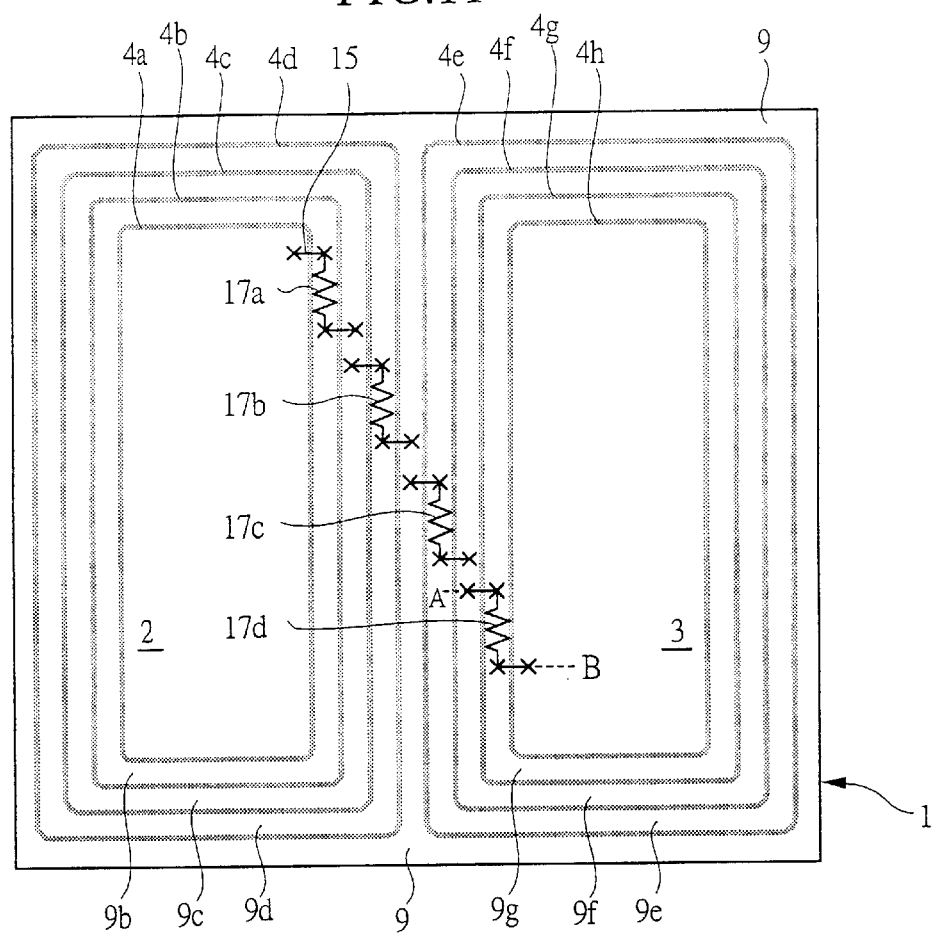
FIG. 11 is a top view of a principal part of a substrate showing a semiconductor integrated circuit device that is a third embodiment of the present invention.
Figure 12:
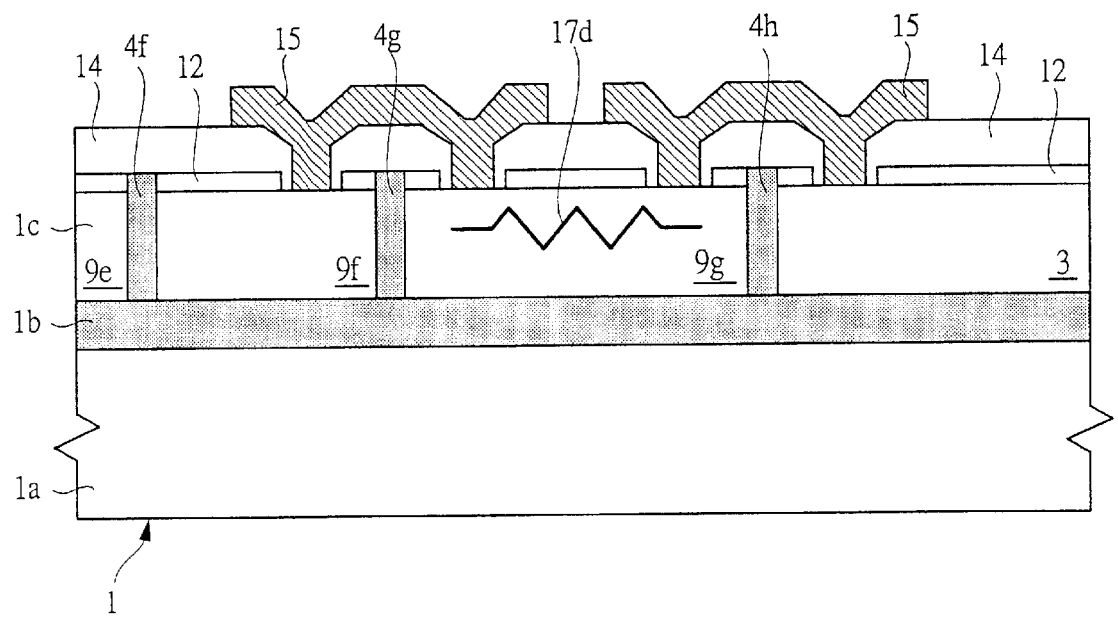
FIG. 12 is a cross-sectional view of a principal part of a substrate showing a semiconductor integrated circuit device that is a third embodiment of the present invention.

FIG. 11 is a top view of a principal part of a semiconductor integrated circuit device that is a third embodiment of the present invention. FIG. 12 is a cross-sectional view taken along line A-B of FIG. 11.

In FIGS. 11 and 12, resistors provided between the inside and outside of each of the insulating isolation trenches (4a to 4h) connected in series are implemented by using diffused resistors 17a to 17d (corresponding to resistor elements).

As shown in FIGS. 11 and 12, for example, an isolating region 9f located between insulating isolation trenches 4f and 4g is connected to an isolating region 9g located between insulating isolation trenches 4g and 4h, by the first layer wiring 15 made of aluminum or the like. The isolating region 9g located between the insulating isolation trenches 4g and 4h is connected to the circuit region 3 by the first layer wiring 15 made of aluminum or the like. That is, the first layer wiring 15 is connected to the first layer wiring 15 via the isolating region 9g (the diffused resistor 17d). The value of the diffused resistor 17d can be controlled by using an impurity concentration of the isolating region 9g (the semiconductor region 1c), the width and length of the isolating region 9g, and the contact distance between the first layer wiring 15 and the isolating region 9g.

Each of other diffused resistors 17a to 17c also is similar in constitution to the diffused resistor 17d.

Numeral 12 denotes a field oxide film, and numeral 14 denotes an interlayer insulating film made of a silicon oxide film or the like. This field oxide film 12 is used to isolate elements formed in the circuit regions. It is also possible that, instead of formation of the field oxide film 12 on the insulating isolation trenches 4b and 4c, the wiring 15 connecting the diffused resistor 17d is formed directly on the isolating region 9b, the insulating isolation trench 4g and the intermediate region 9. Furthermore, the wiring 15 connecting the diffused resistor 17d may be formed directly on the isolating region 9g, the insulating isolation trench 4h and the circuit region 3.

According to the present embodiment, the resistors located between the inside and outside of each of the insulating isolation trenches connected in series are thus implemented by using the diffused resistors of the semiconductor region 1c. As a result, a semiconductor integrated circuit having a high withstand voltage can be formed by a simple constitution.

Fourth Embodiment

Figure 13:
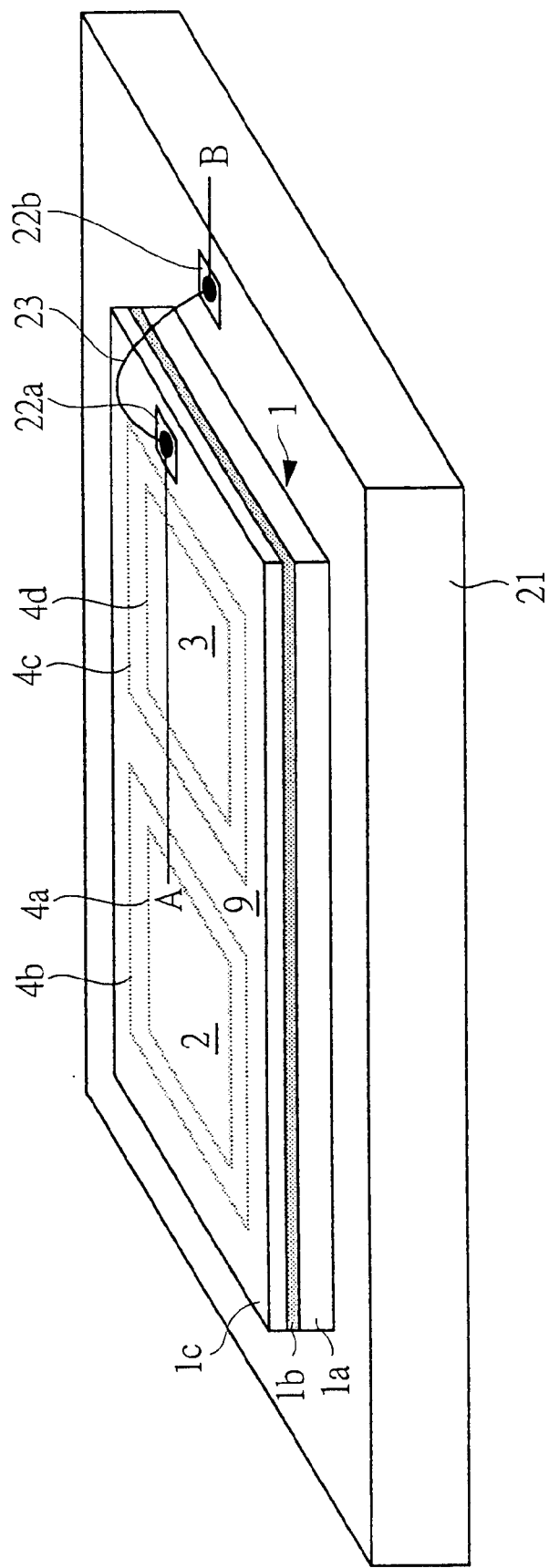
FIG. 13 is a perspective view of a semiconductor integrated circuit device that is a fourth embodiment of the present invention.
Figure 14:
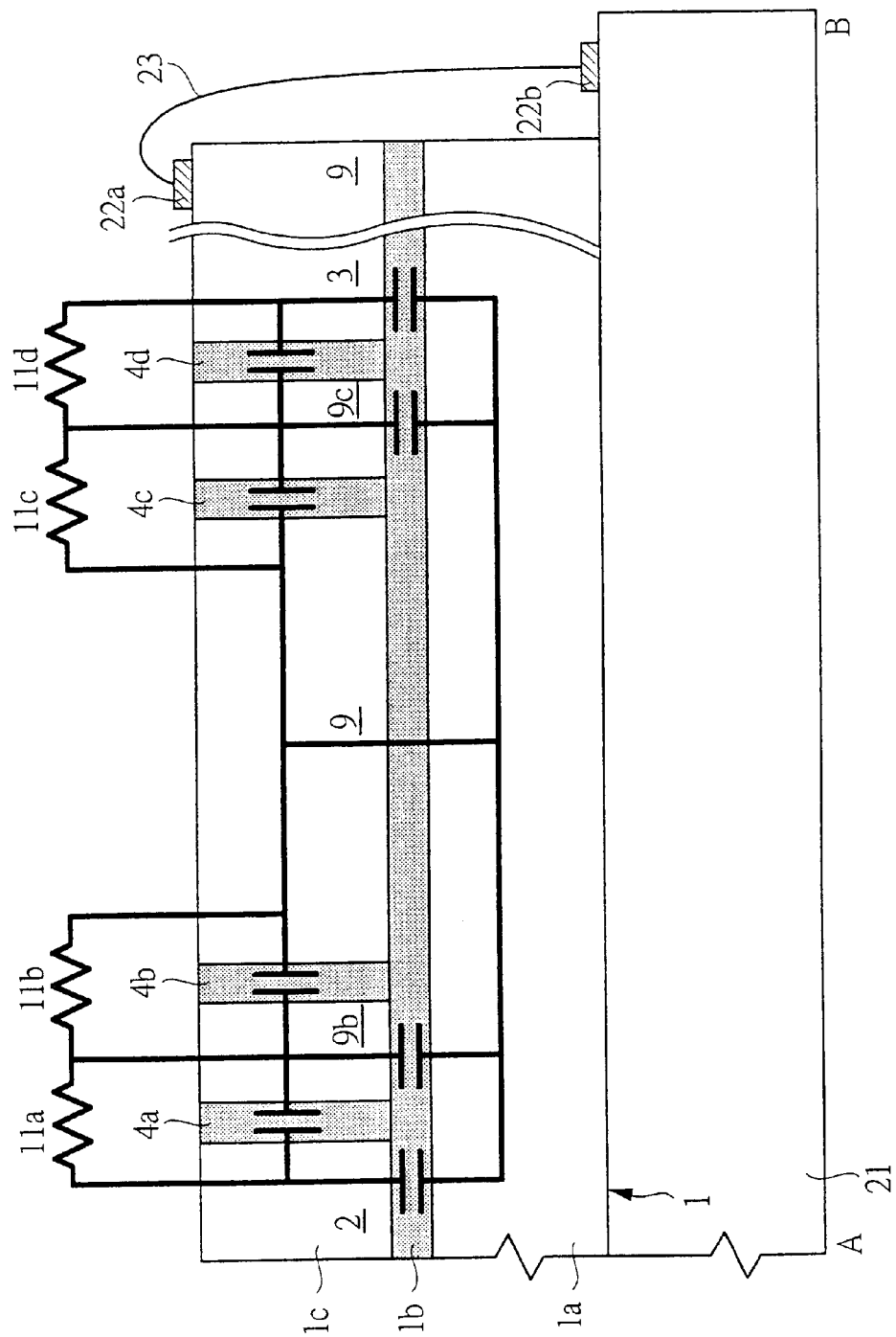
FIG. 14 is a cross-sectional view of a principal part of a substrate showing a semiconductor integrated circuit device that is a fourth embodiment of the present invention.

FIG. 13 is a perspective view of a principal part of a semiconductor integrated circuit device that is a fourth embodiment of the present invention. FIG. 14 is a cross-sectional view taken along line A-B of FIG. 13. In FIG. 13, resistors 11a to 11d shown in FIG. 14 will be omitted.

In the present embodiment, the intermediate region 9 of the semiconductor integrated circuit device shown in FIG. 2 is connected to a die pad 21 mounting an SOI substrate 1, by using a bonding wire 23 (see FIGS. 13 and 14).

The die pad 21 is made of copper or the like. The die pad 21 and the bonding wire 23 are connected via a bonding pad portion 22b on the die pad. Furthermore, the intermediate region 9 and the bonding wire 23 are connected via the bonding pad portion 22a on the intermediate region 9.

In the present embodiment, the intermediate region 9 (the semiconductor region 1c) is thus connected to the die pad 21 mounting the SOI substrate 1, by using the bonding wire 23. Therefore, the intermediate region 9 has the same potential as a supporting layer 1a of the SOI substrate 1 that is in contact with the die pad 21.

Therefore, in addition to the circuit region 2, the isolating region 9b, the intermediate region 9, the isolating region 9c and the circuit region 3, the supporting layer 1a does not lead to the floating state either. It is possible to prevent electric charge such as surge or the like from being stored in the supporting layer 1a.

Fifth Embodiment

Figure 15:
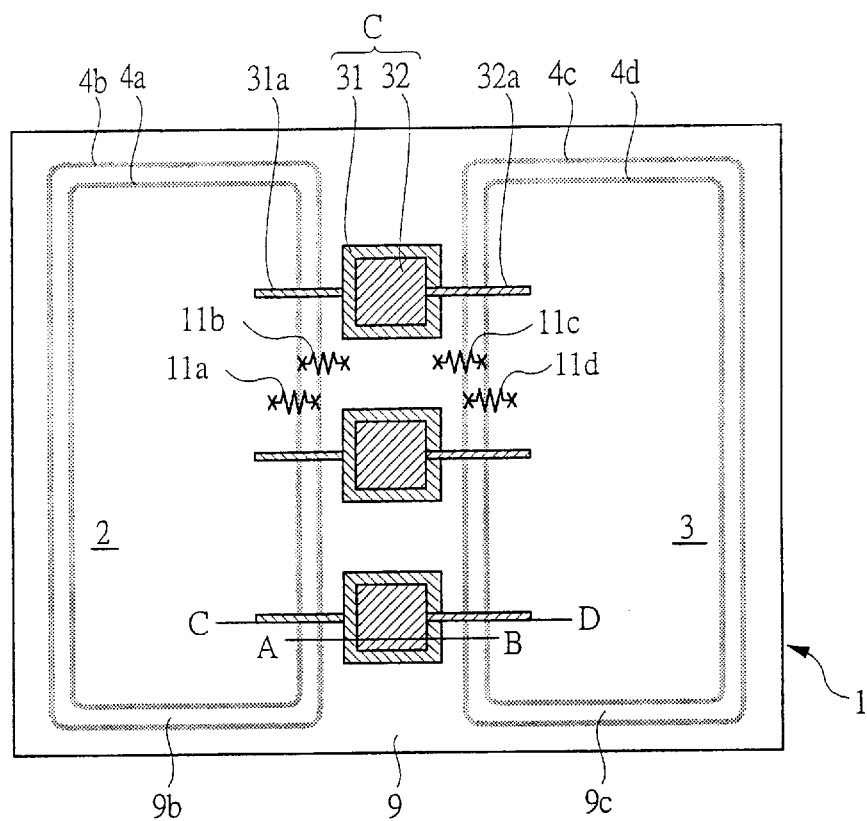
FIG. 15 is a top view of a principal part of a substrate showing a semiconductor integrated circuit device that is a fifth embodiment of the present invention.
Figure 16:
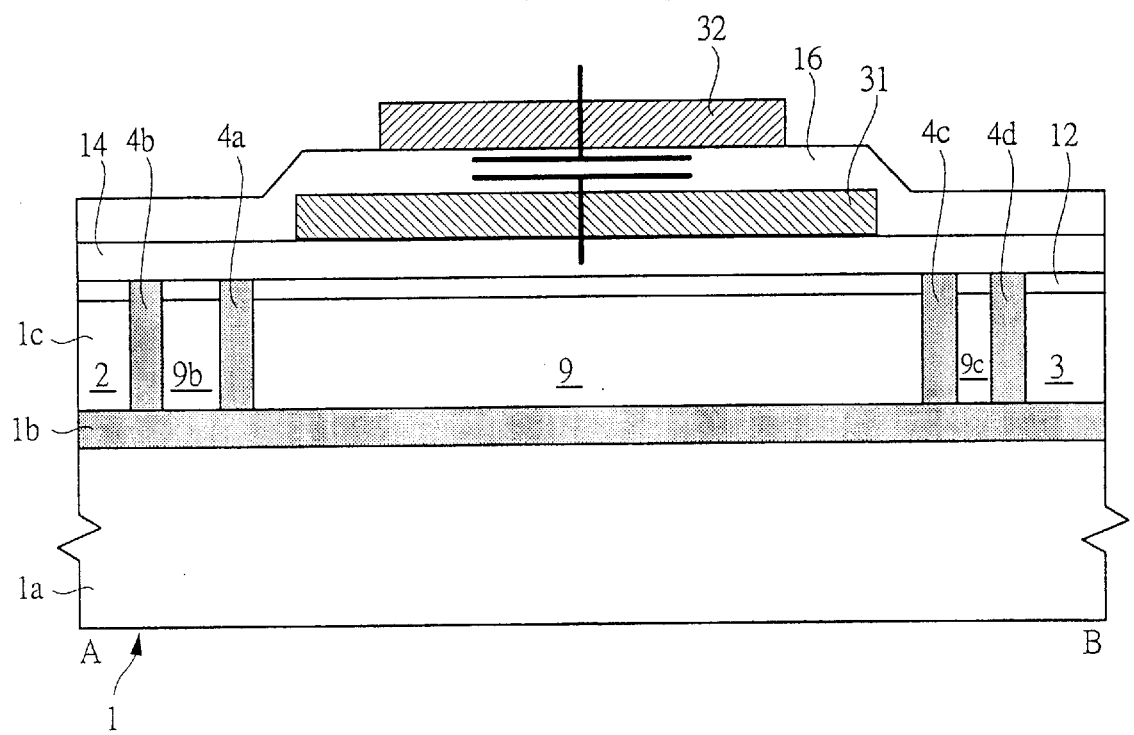
FIG. 16 is a cross-sectional view of a principal part of a substrate showing a semiconductor integrated circuit device that is a fifth embodiment of the present invention.
Figure 17:
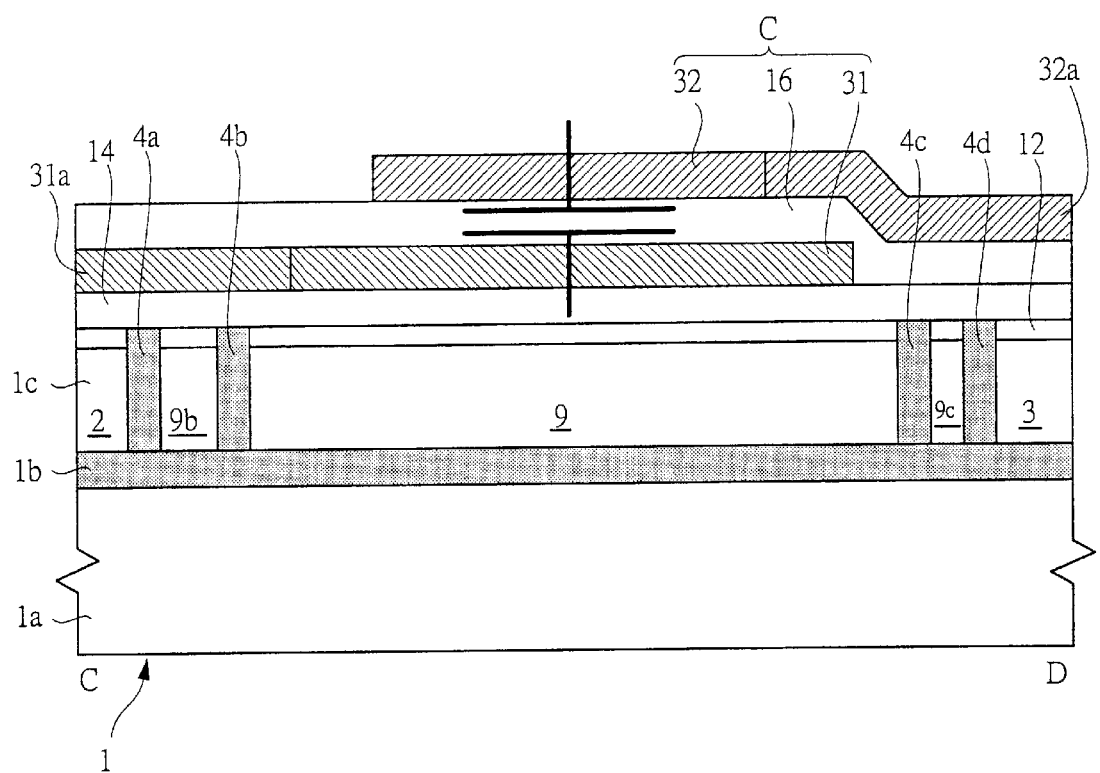
FIG. 17 is a cross-sectional view of a principal part of a substrate showing a semiconductor integrated circuit device that is a fifth embodiment of the present invention.

FIG. 15 is a top view of a principal part of a semiconductor integrated circuit device that is a fifth embodiment of the present invention. FIG. 16 is a cross-sectional view taken along line A-B of FIG. 15. FIG. 17 is a cross-sectional view taken along line C-D of FIG. 15.

In the present embodiment, capacitance elements C are formed between the circuit regions 2 and 3 of the semiconductor integrated circuit device shown in FIG. 1 (see FIG. 15).

As shown in FIGS. 15 to 17, each of the capacitance elements C comprises a lower electrode 31 formed on an interlayer insulating film 14, a capacitance insulating film 16 made of a silicon oxide film or the like and formed on the lower electrode 31, and an upper electrode 32 formed on the capacitance insulating film 16.

Each lower electrode 31 of the capacitance elements C is connected to the circuit region 2 via a wiring 31a. Furthermore, each upper electrode 32 of the capacitance elements C is connected to the circuit region 3 via a wiring 32a.

The lower electrode 31 and the wiring 31a can be formed, for example, by using the same layer as the first layer wiring 15 shown in FIG. 10. Furthermore, the upper electrode 32 and the wiring 32a can be formed, for example, by using the same layer as a second layer wiring formed on the first layer wiring via an interlayer insulating film. In this case, the interlayer insulating film can be used as the capacitance insulating film 16.

Via each capacitance element C, a signal transferred to an element on the circuit region 2 is transmitted to an element formed on the circuit region 3. Furthermore, a signal transferred to the element on the circuit region 3 is transmitted to the element formed on the circuit region 2. Since having the capacitance insulating film 16 interposed therein, each capacitance element C described above transmits only an electric signal while maintaining the insulating states between the upper electrode 32 and the lower electrode 31. Accordingly, the capacitance elements C are called isolators.

In this case, the withstand voltage depends on not only the insulating isolation trenches (4a to 4d) connected in series and the interlayer insulating film 14 but also the capacitance elements C. That is, by comparing capacitance between each of the respective insulating isolation trenches (4a to 4d) connected in series and the interlayer insulating film 14, with capacitance of each of the capacitance elements C, the withstand voltage is determined by smaller one. In designing the capacitance elements C, therefore, an above-mentioned point must be considered.

In the present embodiment, since the capacitance elements C are thus formed between the circuit regions 2 and 3, only an electric signal can be transmitted while the insulating state of the upper electrode 32 and the lower electrode 31 is maintained. In addition, in the present embodiment, since the capacitance elements C can be easily formed on the SOI substrate 1, both the isolator and respective circuit elements formed on the circuit regions 2 and 3 can be used as one chip. Therefore, this results in compact forms of these elements. Furthermore, it is not necessary to form the isolator as a different part, and thereby to reduce the manufacturing costs thereof.

Sixth Embodiment

Figure 18:
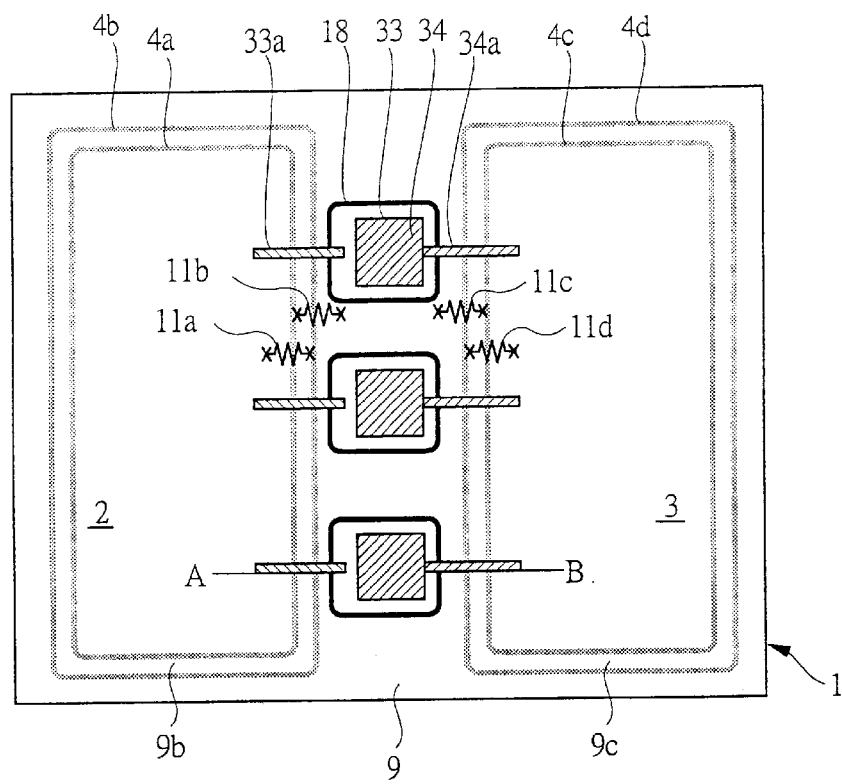
FIG. 18 is a top view of a principal part of a substrate showing a semiconductor integrated circuit device that is a sixth embodiment of the present invention.
Figure 19:
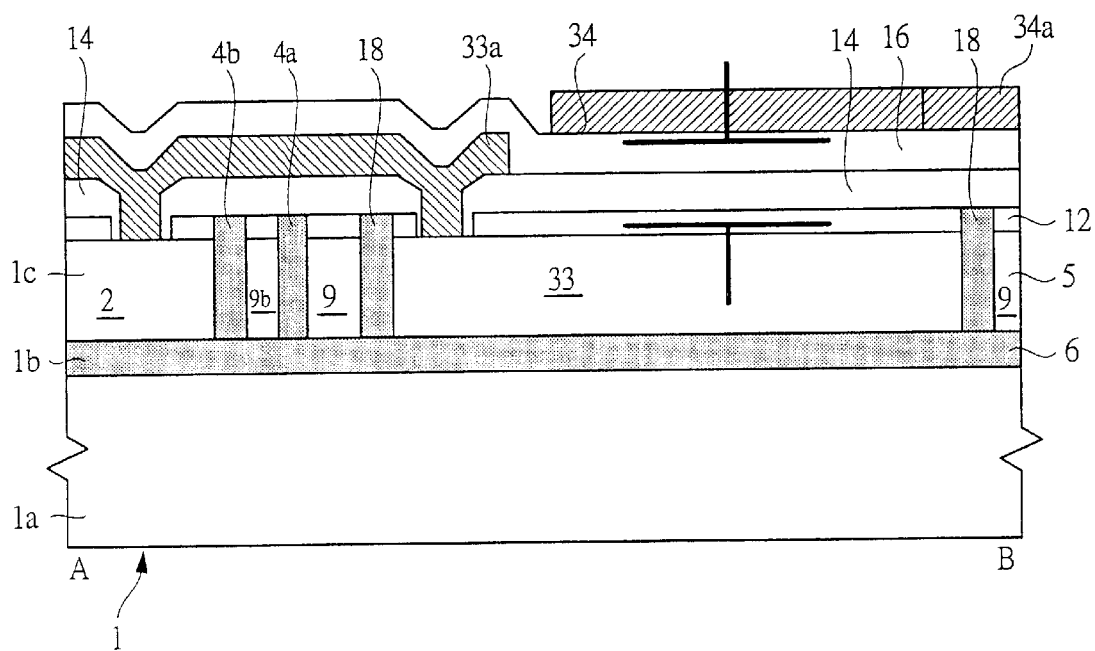
FIG. 19 is a cross-sectional view of a principal part of a substrate showing a semiconductor integrated circuit device that is a sixth embodiment of the present invention.

FIG. 18 is a top view of a principal part of a semiconductor integrated circuit device that is a sixth embodiment of the present invention. FIG. 19 is a cross-sectional view taken along line A-B of FIG. 18.

In FIG. 18, each capacitance element C shown in FIG. 16 is constituted by a semiconductor region 33; a capacitance insulating film comprising a field oxide film 12 formed on the semiconductor region 1c, an interlayer insulating film 14, and a silicon oxide film 16; and an upper electrode 34 (see FIG. 19). Here, each semiconductor region 33 means a region surrounded by each insulating isolation trench 18 in the semiconductor region 1c. Each capacitance insulating film may be constituted by the field oxide film 12 and the interlayer insulating film 14, and each upper electrode 34 and a wiring 34a may be formed on the interlayer insulating film 14.

Each semiconductor region 33 serving as each lower electrode of the capacitance elements C is connected to the circuit region 2 by a wiring 33a. Furthermore, each upper electrode 34 of the capacitance elements C is connected to the circuit region 3 by the wiring 34a.

Each wiring 33a connected to each semiconductor region 33 serving as a lower electrode can be formed, for example, of the same layer as the first layer wiring 15 shown in FIG. 10. Each upper electrode 34 and each wiring 34a can be formed, for example, of the same layer as the second layer wiring formed on the first layer wiring via the interlayer insulating film.

Via each capacitance element C, a signal transferred to an element on the circuit region 2 is transmitted to an element formed on the circuit region 3 similarly to the fifth embodiment. Furthermore, a signal transferred to the element on the circuit region 3 is transmitted to the element formed on the circuit region 2. Each insulating isolation trench 18 described above functions as prevention of the electric signal from leaking to other regions and elements.

Seventh Embodiment

Figure 20:
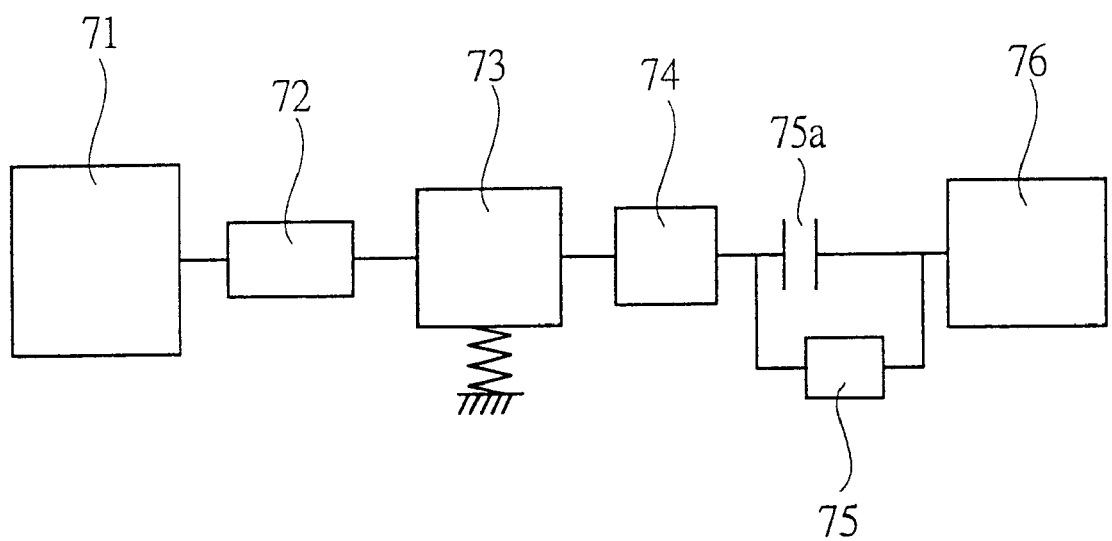
FIG. 20 is a block diagram showing a mode for using a semiconductor integrated circuit device of the present invention.

FIG. 20 is a block diagram showing a mode for using a semiconductor integrated circuit device of the present invention. As shown in FIG. 20, a semiconductor integrated circuit device 76 according to the present invention receives a signal transmitted from a station-side apparatus 71, and transfers the signal to an apparatus such as a personal computer. The signal is transmitted from the station-side apparatus 71 to the semiconductor integrated circuit device 76 via a line 72, a surge absorption circuit 73, and a balance circuit 74. A capacitor 75a and a power supply circuit 75 are connected between the balance circuit 74 and the semiconductor integrated circuit device 76.

For example, a thunder-shaped surge, an induced voltage or the like is applied onto the above-mentioned line 72, and voltage of the line increases.

Here, the thunder-shaped surge means a voltage rise caused by the falling of a thunderbolt, and the induced voltage means a voltage rise caused by electromagnetic coupling between a telephone line and a power cable laid down in parallel thereto.

A voltage waveform caused by the thunder-shaped surge has an impulse shape and is absorbed by the surge absorption circuit 73 or the like. Furthermore, since the induced voltage has a commercial frequency of 50 Hz/60 Hz, the surge absorption circuit 73 can not absorb the commercial frequency thereof, so that there is such a disadvantage that the induction voltage may be applied to the semiconductor integrated circuit device 76.

Therefore, the semiconductor integrated circuit device 76 is required to have a withstand voltage which can withstand the above-mentioned induced voltage.

The case will be studied where the withstand voltage standard is an AC voltage of 1500 V in order to withstand this induced voltage. In this case, by taking a margin (approximately 300 V) of the withstand voltage and variation of peak values of the AC voltage into consideration, the goal of the withstand voltage is set to an AC voltage of 3000 V.

If each of the above-mentioned insulating isolation trenches has a withstand voltage of 100 V, approximately thirty insulating isolation trenches are required to satisfy a withstand voltage of 3000 V.

Figure 21:
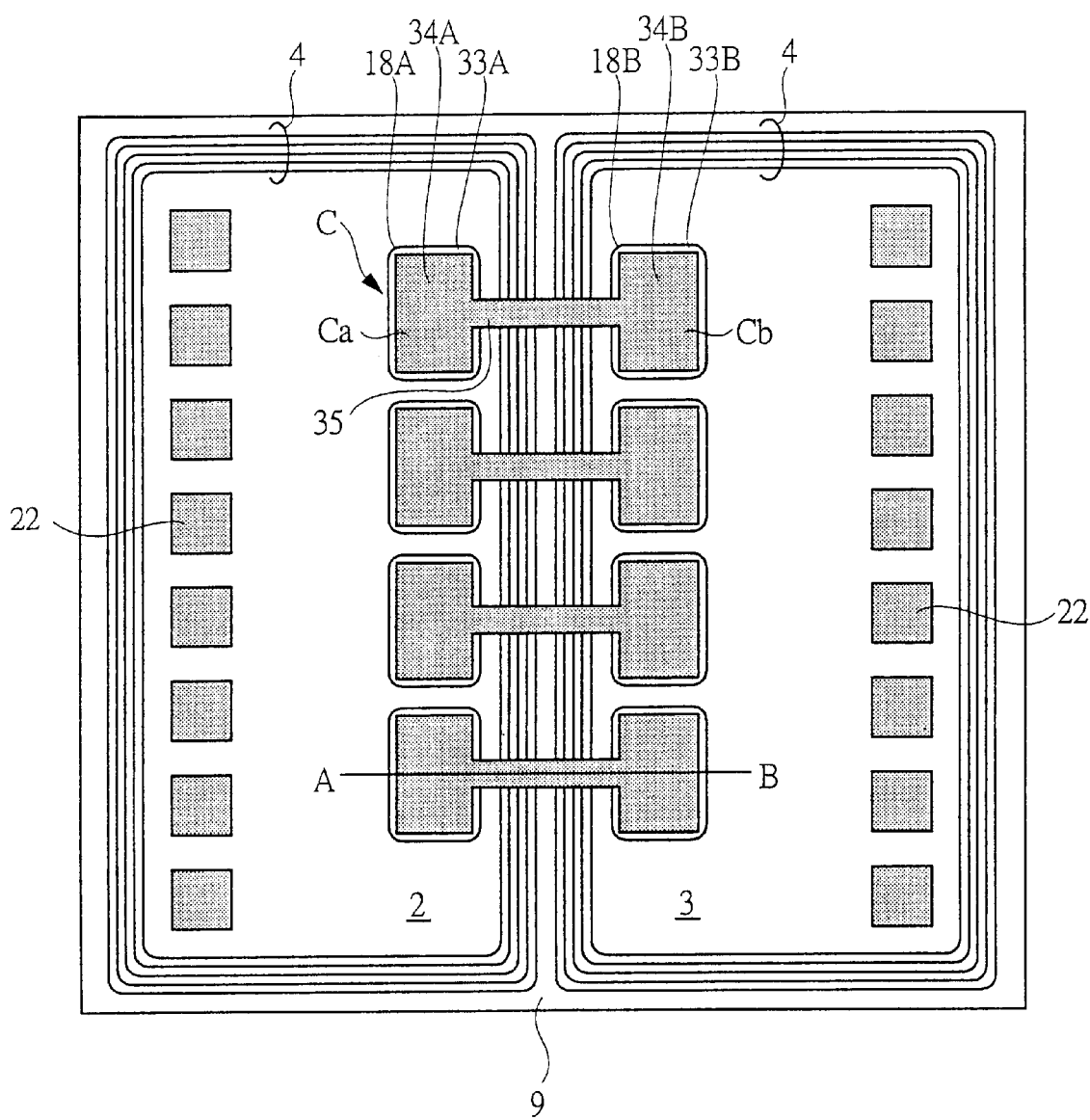
FIG. 21 is a top view of a principal part of a substrate showing a semiconductor integrated circuit device that is a seventh embodiment of the present invention.
Figure 22:
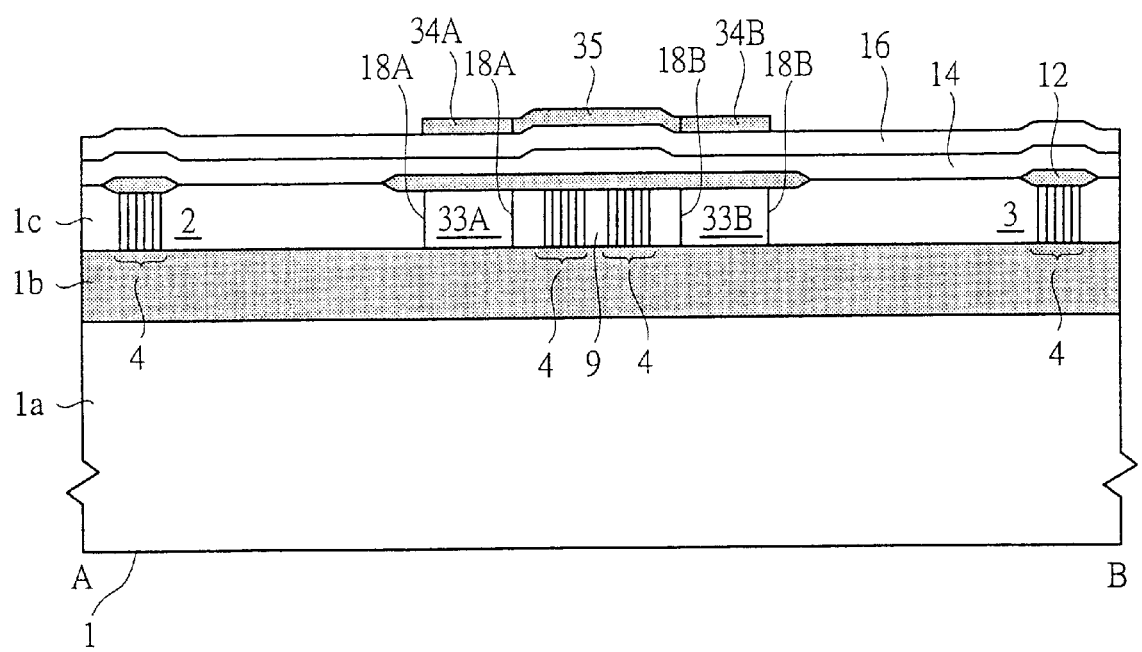
FIG. 22 is a cross-sectional view of a principal part of a substrate showing a semiconductor integrated circuit device that is a seventh embodiment of the present invention.

FIG. 21 is a top view of a principal part of a semiconductor integrated circuit device that is a seventh embodiment of the present invention. FIG. 22 is a cross-sectional view taken along line A-B shown in FIG. 21. In the semiconductor integrated circuit device of the present embodiment, each of the circuit regions 2 and 3 is surrounded by seventeen insulating isolation trenches 4. Therefore, the circuit regions 2 and 3 are separated from each other by a total of thirty-four insulating isolation trenches 4. In FIG. 21, only six insulating isolation trenches surrounding each of the circuit regions 2 and 3 are shown and the remaining insulating isolation trenches will be omitted.

In the present embodiment, four capacitance elements C are provided, and each of the capacitance elements C comprises capacitance portions Ca and Cb formed on the respective circuit regions 2 and 3. This capacitance portion Ca includes a semiconductor region 33A; a capacitance insulating film comprising an interlayer insulating film 14 and a silicon oxide film 16; and an upper electrode 34A formed on the silicon oxide film 16. The capacitance portion Cb includes a semiconductor region 33B; a field oxide film 12 formed on the semiconductor region 33B; a capacitance insulating film comprising an interlayer insulating film 14 and a silicon oxide film 16; and an upper electrode 34B formed on the silicon oxide film 16. Here, the semiconductor regions 33A and 33B mean regions surrounded by the insulating isolation trenches 18A and 18B in the semiconductor region 1c, respectively. The upper electrodes 34A and 34B are connected by a wiring portion 35.

The upper electrodes 34A and 34B and the wiring portion 35 can be formed, for example, by using the same layer as a second layer wiring formed on the first layer wiring via an interlayer insulating film.

Via each capacitance element C, a signal transferred to an element on the circuit region 2 is transmitted to an element formed on the circuit region 3 in the same way as the fifth embodiment. Furthermore, a signal transferred to the element on the circuit region 3 is transmitted to the element formed on the circuit region 2. In the present embodiment, four capacitance elements C are formed. Among them, two capacitance elements C are used to transmit a signal from the circuit region 2 to the circuit region 3, and two remaining capacitance elements C are used to transmit a signal from the circuit region 3 to the circuit region 2. One channel is constituted by one capacitance element C for transmitting a signal from the circuit region 2 to the circuit region 3 and one capacitance element C for transmitting a signal from the circuit region 3 to the circuit region 2, so that the present embodiment has two channels.

On each periphery of the circuit regions 2 and 3, bonding pad portions 22 are formed (see FIG. 21).

In the present embodiment, the number of insulating isolation trenches between the circuit regions 2 and 3 is set to thirty or more, and thereby a high withstand voltage can be obtained. In addition, each capacitance element C is constituted by the capacitance portions Ca and Cb formed on each of the circuit regions 2 and 3, and these capacitance portions are connected by the wiring portion 35. As a result, it is possible to increase each withstand voltage of the capacitance elements C. Furthermore, in the present embodiment, the insulating layer 1b constituting the SOI substrate is also made as thick as 3 μm in order to ensure the withstand voltage.

However, similarly to above description, even if the number of insulating isolation trenches 4 is increased, there occurs non-uniformity of voltages applied to the insulating isolation trenches, and thereby the withstand voltage of the number of the insulating isolation trenches×100 V (that is, 3400 V in the case of the present embodiment) cannot be ensured.

In fact, the withstand voltage ensured by the case of the present embodiment becomes approximately 2000 V. Although the withstand voltage standard of 1500 V is satisfied, the aimed withstand voltage of 3000 V cannot be obtained.

Eighth Embodiment

Figure 23:
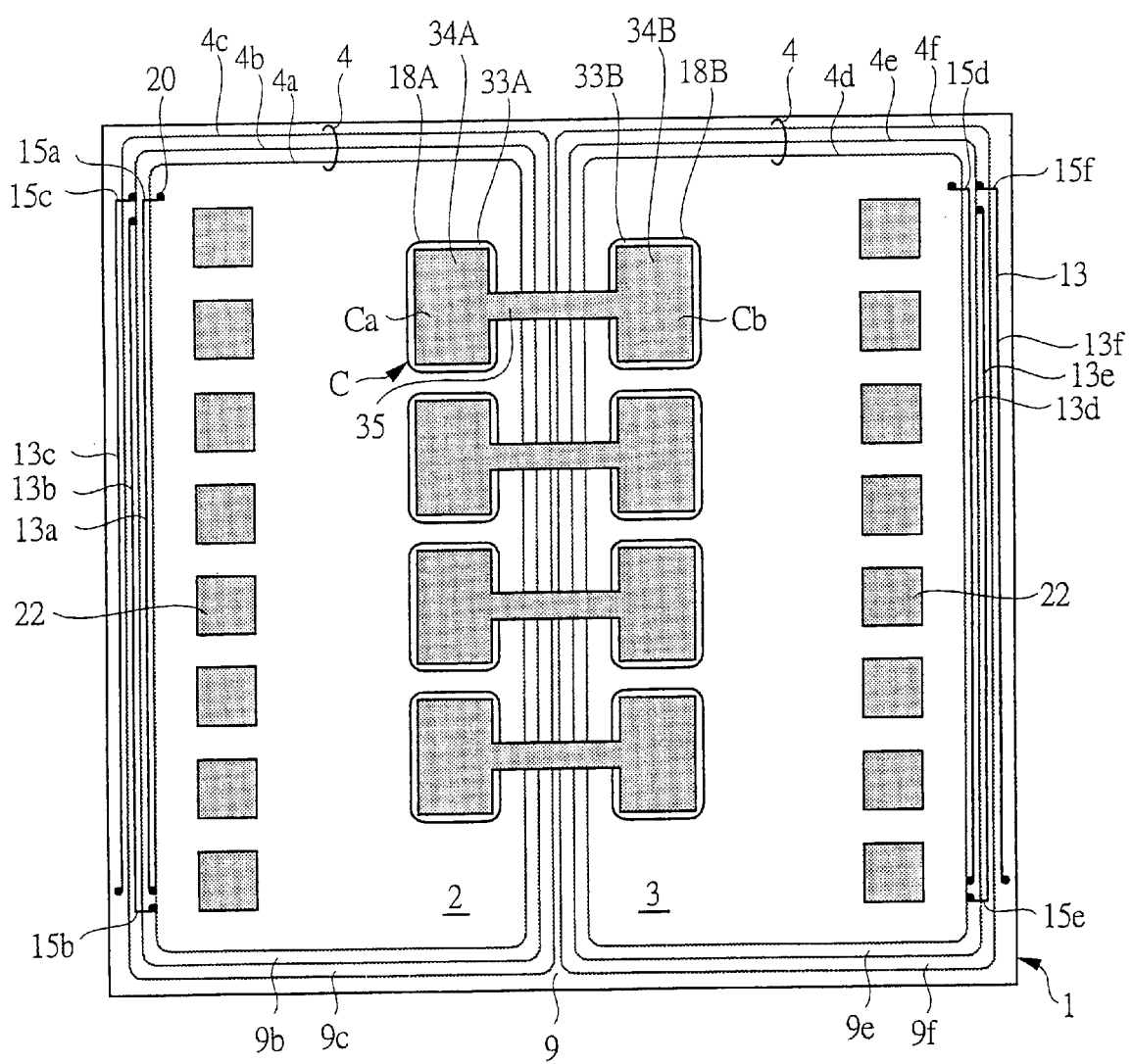
FIG. 23 is a top view of a principal part of a substrate showing a semiconductor integrated circuit device that is an eighth embodiment of the present invention.

FIG. 23 is a top view of a principal part of a semiconductor integrated circuit device that is an eighth embodiment of the present invention.

In the semiconductor integrated circuit device of the present embodiment, each of the circuit regions 2 and 3 is surrounded by the seventeen insulating isolation trenches 4. Therefore, the circuit regions 2 and 3 are separated from one another by a total of thirty-four insulating isolation trenches 4. In FIG. 23, only three inner insulating isolation trenches surrounding each of the circuit regions 2 and 3 are shown, and the remaining insulating isolation trenches will be omitted.

Furthermore, in the semiconductor integrated circuit device of the present embodiment, the circuit region 2 is connected to an isolating region 9b via a first layer wiring 15a and a wiring resistor 13a. This wiring resistor 13a is also formed along an insulating isolation trench 4a. In FIG. 23, black circle portions 20 represent connecting portions between the circuit region 2 and the first layer wiring 15a to 15f or the wiring resistors 13a to 13f, between the circuit region 3 and the first layer wiring 15a to 15f or the wiring resistors 13a to 13f, between the isolating region 9b and the first layer wiring 15a to 15f or the wiring resistors 13a to 13f, between the isolating region 9c and the first layer wiring 15a to 15f or the wiring resistors 13a to 13f, between the isolating region 9e and the first layer wiring 15a to 15f or the wiring resistors 13a to 13f, between the isolating region 9f and the first layer wiring 15a to 15f or the wiring resistors 13a to 13f, and between the intermediate region 9 and the first layer wiring 15a to 15f or the wiring resistors 13a to 13f. The isolating region 9b and the isolating region 9c are also connected via the wiring resistor 13b in the same way. In addition, the isolating region 9c and the intermediate region 9 are also connected via the wiring resistor 13c in the same way.

Furthermore, in the integrated circuit device of the present embodiment, the circuit region 3 and the isolating region 9e are connected via the first layer wiring 15d and the wiring resistor 13d. This wiring resistor is formed along the insulating isolation trench 4d. Furthermore, the isolating region 9e and the isolating region 9f are also connected by the wiring resistor 13e in the same way. Additionally, the isolating region 9f and the intermediate region 9 are also connected by the wiring resistor 13f in the same way.

Since the remaining constitutions thereof are similar to the case of the seventh embodiment, description thereof will be omitted.

According to the present embodiment, the voltage as described in detail in the first embodiment is distributed due to the wiring resistors 13a to 13f or the like. Therefore, the voltage applied to the insulating isolation trenches 4a to 4f or the like can be made uniform, and thereby increase the withstand voltage. Furthermore, in the present embodiment, each of the circuit regions 2 and 3 is surrounded by the seventeen insulating isolation trenches 4a to 4f or the like. That is, each of the circuit regions 2 and 3 is separated from each other by thirty or more (a total of thirty-four) of the insulating isolation trenches 4. As a result, the withstand voltage of 3000 V can be obtained.

Ninth Embodiment

Figure 24:
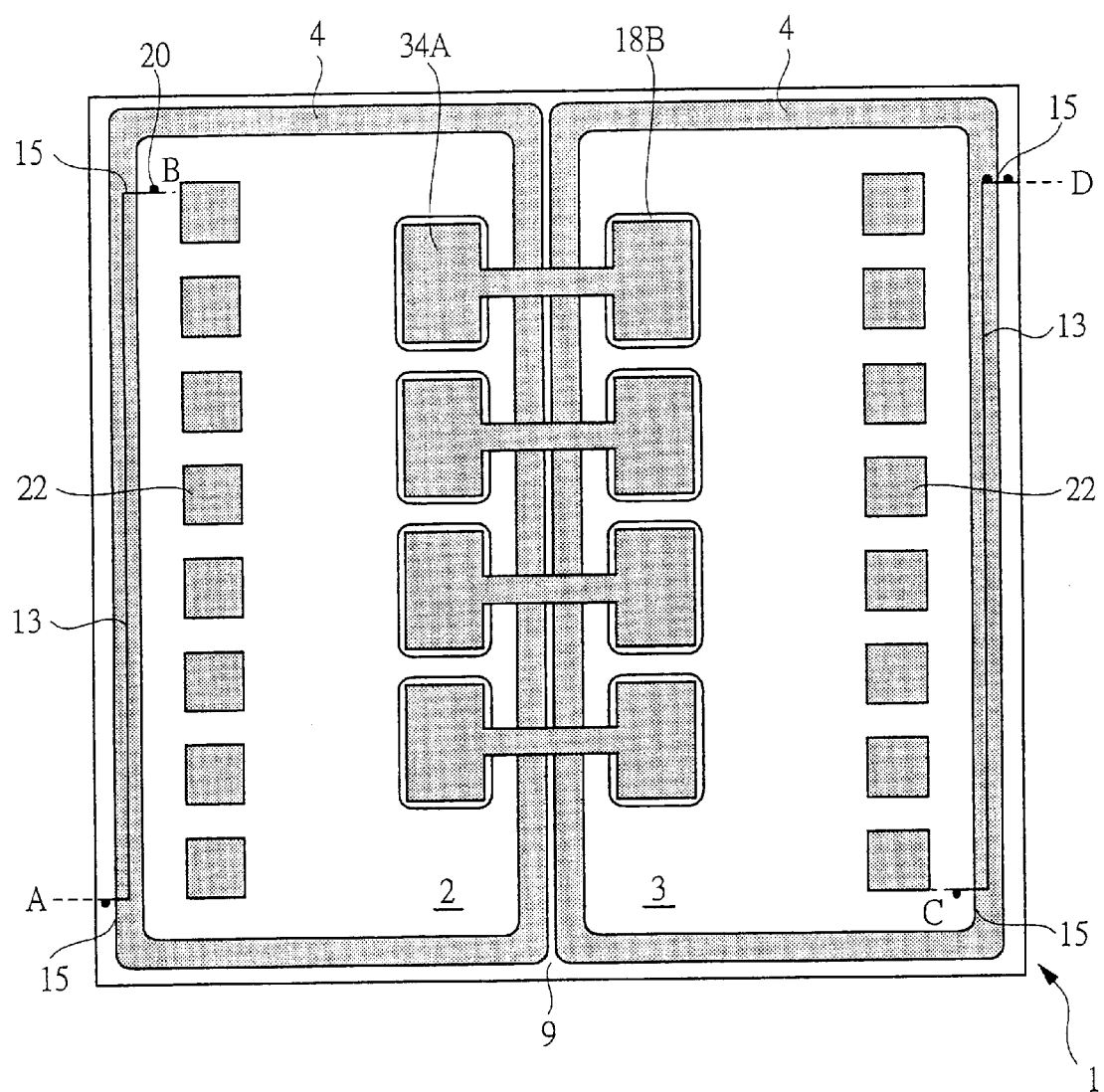
FIG. 24 is a top view of a principal part of a substrate showing a semiconductor integrated circuit device that is a ninth embodiment of the present invention.

FIG. 24 is a top view of a principal part of a semiconductor integrated circuit device that is a ninth embodiment of the present invention.

In the semiconductor integrated circuit device of the present embodiment, each of the circuit regions 2 and 3 is surrounded by a wide insulating isolation trench 4. Although each of the circuit regions 2 and 3 is surrounded by one wide insulating isolation trench 4 in FIG. 24, each of the circuit regions 2 and 3 may be surrounded by a plurality of wide insulating isolation trenches 4.

Furthermore, in the semiconductor integrated circuit device of the present embodiment, the circuit region 2 and the intermediate region 9 are connected via the first layer wiring 15 and the wiring resistor 13. The wiring resistor 13 is formed along the insulating isolation trench 4. In FIG. 24, black circle portions 20 represent connecting portions between the circuit regions 2 and the first layer wiring 15 or the wiring resistor 13, between the circuit regions 3 and the first layer wiring 15 or the wiring resistor 13, and between the intermediate region 9 and the first layer wiring 15 or the wiring resistor 13.

In the same way, the circuit region 3 and the intermediate region 9 are connected via the wiring resistor 13. The wiring resistor 13 is formed along the insulating isolation trench 4.

The remaining constitution is similar to the case of the seventh embodiment, and thereby description thereof will be omitted.

According to the present embodiment, the wiring resistors 13 are thus connected between the circuit region 2 and the intermediate region 9 and between the circuit region 3 and the intermediate region 9. Therefore, the voltage as described in detail in the first embodiment is distributed by the wiring resistor 13, so that the voltage applied to the insulating isolation trenches can be made uniform, and the withstand voltage thereof can be increased. Furthermore, in the present embodiment, since each of the circuit regions 2 and 3 is surrounded by the wide insulating isolation trench 4, the withstand voltage thereof can be increased. In addition, since the each of the circuit regions 2 and 3 is surrounded by the wide insulating isolation trench 4, the intermediate region 9 becomes smaller. As a result, because the region which will arrive at the floating state is reduced, the voltage applied to each insulating isolation trench can be made uniform easily.

Tenth Embodiment

Figure 25:
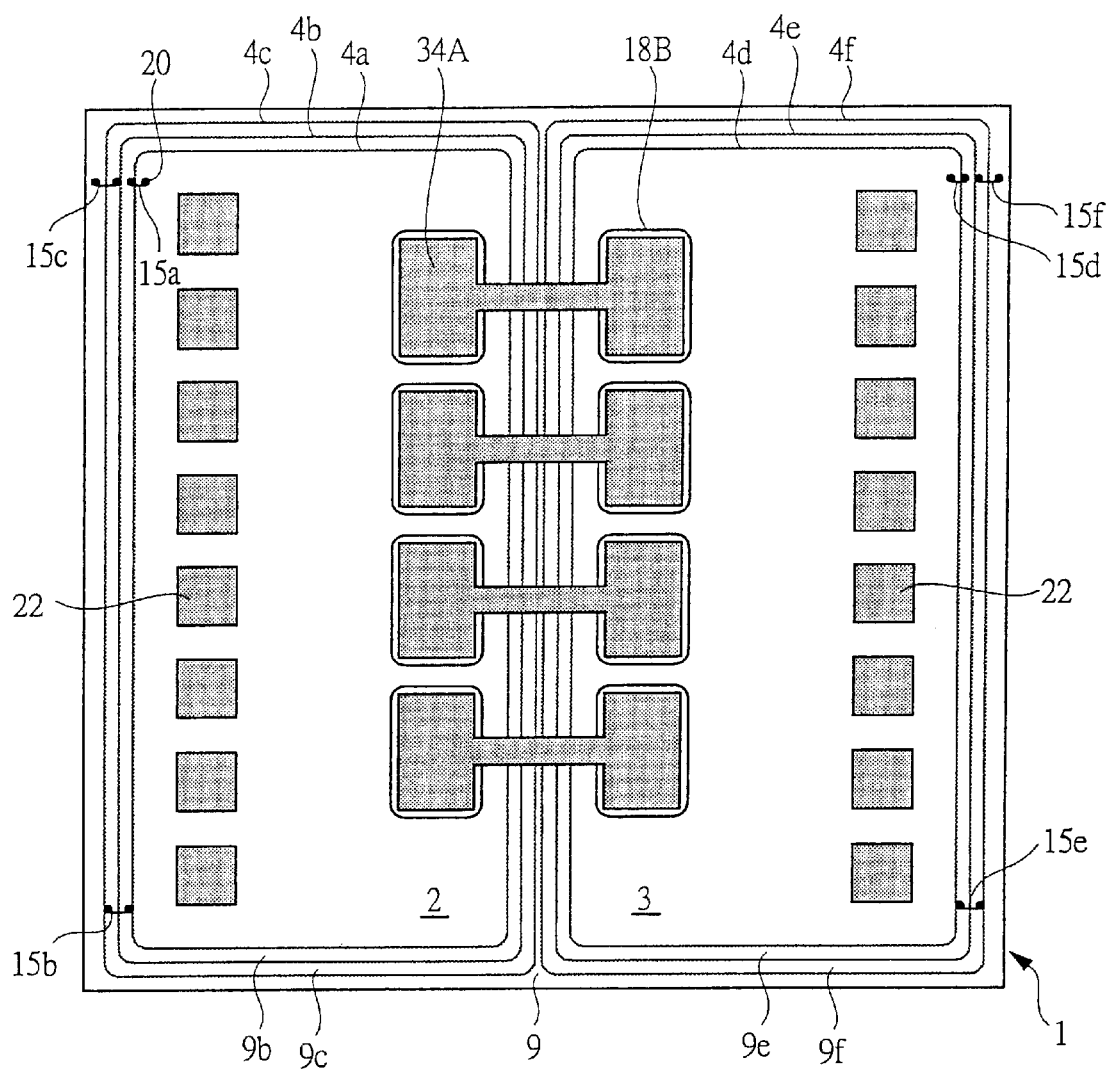
FIG. 25 is a top view of a principal part of a substrate showing a semiconductor integrated circuit device that is a tenth embodiment of the present invention.

FIG. 25 is a top view of a principal part of a semiconductor integrated circuit device that is a tenth embodiment of the present invention.

In the semiconductor integrated circuit device of the present embodiment, the circuit region 2 is surrounded by three insulating isolation trenches 4a to 4c, and the circuit region 3 is surrounded by three insulating isolation trenches 4d to 4f. The number of insulating isolation trenches 4 that surround each of the circuit regions 2 and 3 may be four or more. In the case where each of the circuit regions 2 and 3 is surrounded by seventeen insulating isolation trenches, it is possible to obtain the withstand voltage of 3000 V or more.

In the semiconductor integrated circuit device of the present embodiment, a diffused resistor (a resistor element) is connected between the circuit region 2 and the isolating region 9b. That is, the intermediate region 9 and the isolating region 9c, the isolating region 9c and the isolating region 9b, and the isolating region 9b and the circuit region 2 are connected via first layer wiring 15c, 15b and 15a, respectively. Furthermore, the intermediate region 9 and the isolating region 9f, the isolating region 9f and the isolating region 9e, and the isolating region 9e and the circuit region 3 are connected via first layer wiring 15f, 15e and 15d, respectively. In FIG. 25, black circle portions 20 represent connection portions between the circuit regions 2 and the first layer wirings 15a to 15f, between the circuit region 3 and the first layer wirings 15a to 15f, between the isolating region 9b and the first layer wirings 15a to 15f, between the isolating region 9c and the first layer wirings 15a to 15f, between the isolating region 9e and the first layer wirings 15a to 15f, between the isolating region 9f and the first layer wirings 15a to 15f, and between the intermediate region 9 and the first layer wirings 15a to 15f.

The first layer wirings 15c and 15a are located in a left top corner portion of the SOI substrate 1 (approximately rectangular circuit region 2), whereas the first layer wiring 15b is located in a left bottom corner portion. Therefore, the isolating regions 9c and 9d having a length corresponding to nearly one side of the nearly rectangle-shaped circuit region 2 can be utilized as diffused resistors. Similarly to this, the isolating regions 9f and 9e having a length corresponding to nearly one side of the circuit region 3 can also be utilized as diffused resistors. The remaining constitution is similar to the case of the seventh embodiment, and thereby description thereof will be omitted.

According to the present embodiment, the diffused resistors are thus connected between the circuit region 2 and the intermediate region 9 and between the circuit region 3 and the intermediate region 9, respectively. Therefore, since the voltage as described in detail in the first embodiment is distributed by the diffused resistors, each voltage applied to the insulating isolation trenches can be made uniform and thereby the withstand voltage can be increased. Furthermore, the diffused resistors can be formed in an easy process.

Eleventh Embodiment

Figure 26:
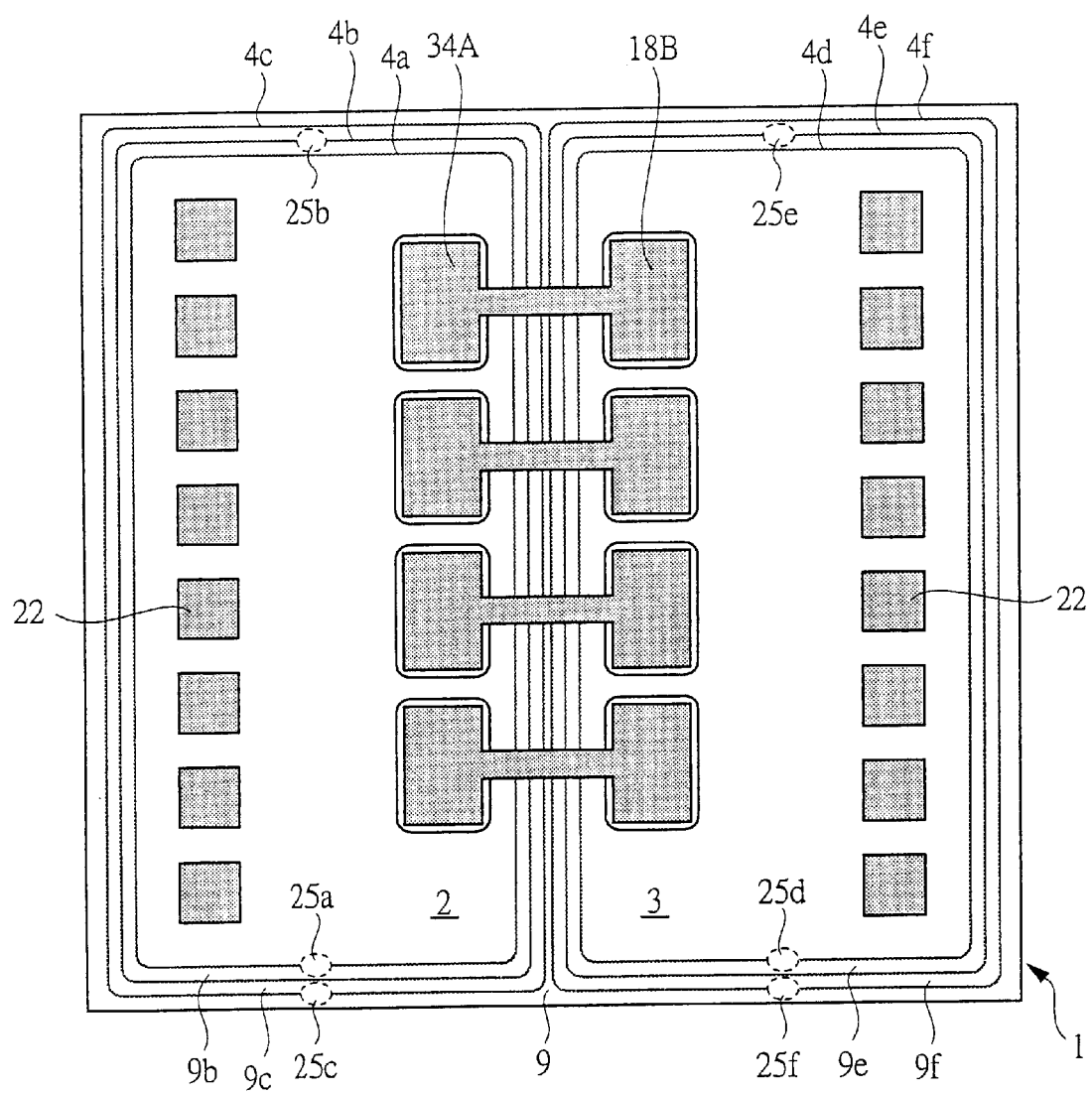
FIG. 26 is a top view of a principal part of a substrate showing a semiconductor integrated circuit device that is an eleventh embodiment of the present invention.

FIG. 26 is a top view of a principal part of a semiconductor integrated circuit device that is an eleventh embodiment of the present invention.

In the semiconductor integrated circuit device of the present embodiment, similarly to the tenth embodiment, each of the circuit regions 2 and 3 is surrounded by three insulating isolation trenches 4. Although these insulating isolation trenches are not formed over the entire periphery of the circuit region 2 or 3, shortcircuit regions (connecting portions) 25a to 25f as shown in FIG. 26 are formed. The number of insulating isolation trenches that surround each of the circuit regions 2 and 3 may be three or more. In the case where the circuit regions 2 and 3 are surrounded by seventeen insulating isolation trenches, a withstand voltage of 3000 V or more can be obtained as described above.

In the semiconductor integrated circuit device of the present embodiment, therefore, the diffused resistors are connected between the circuit region 2 and the intermediate region 9. That is, the intermediate region 9 and the isolating region 9c, the isolating region 9c and the isolating region 9b, and the isolating region 9b and the circuit region 2 are connected via shortcircuit regions 25c, 25b and 25a, respectively. Furthermore, the intermediate region 9 and the isolating region 9f, the isolating region 9f and the isolating region 9e, and the isolating region 9e and the circuit region 3 are connected via shortcircuit regions 25f, 25e and 25d, respectively.

The shortcircuit regions 25c and 25a are located in the center of a short side of the nearly rectangle-shaped circuit region 2 (a bottom part in FIG. 26), whereas the shortcircuit region 25b is located in the center of a side opposed to the above-mentioned short side (a top part in FIG. 26). Furthermore, the shortcircuit regions 25d and 25f are located in the center of a short side of the nearly rectangle-shaped circuit region 3 (a bottom part in FIG. 26), whereas the shortcircuit region 25e is located in the center of a side opposed to the above-mentioned short side (a top part in FIG. 26).

Therefore, each of the isolating regions 9c and 9d having a length equal to nearly half of the entire periphery of the nearly rectangle-shaped circuit region 2 can be utilized as a diffused resistor. And, each of the isolating regions 9e and 9f having a length equal to nearly half of the entire periphery of the circuit region 3 can be utilized as a diffused resistor. The remaining constitution is similar to the case of the seventh embodiment, and thereby description thereof will be omitted.

According to the present embodiment, by the diffused resistors, the circuit region 2 and the intermediate region 9 are thus connected, and the circuit region 3 and the intermediate region 9 are connected. Therefore, since the voltage as described in detail in the second embodiment is distributed by the diffused resistors, each voltage applied to the insulating isolation trenches can be made uniform and thereby the withstand voltage can be increased. And, since it is unnecessary to form wirings and connecting portions, the diffused resistors can be formed in an easy process. Additionally, the degree of integration of elements can be improved and the chip area thereof can be reduced.

Twelfth Embodiment

Figure 27:
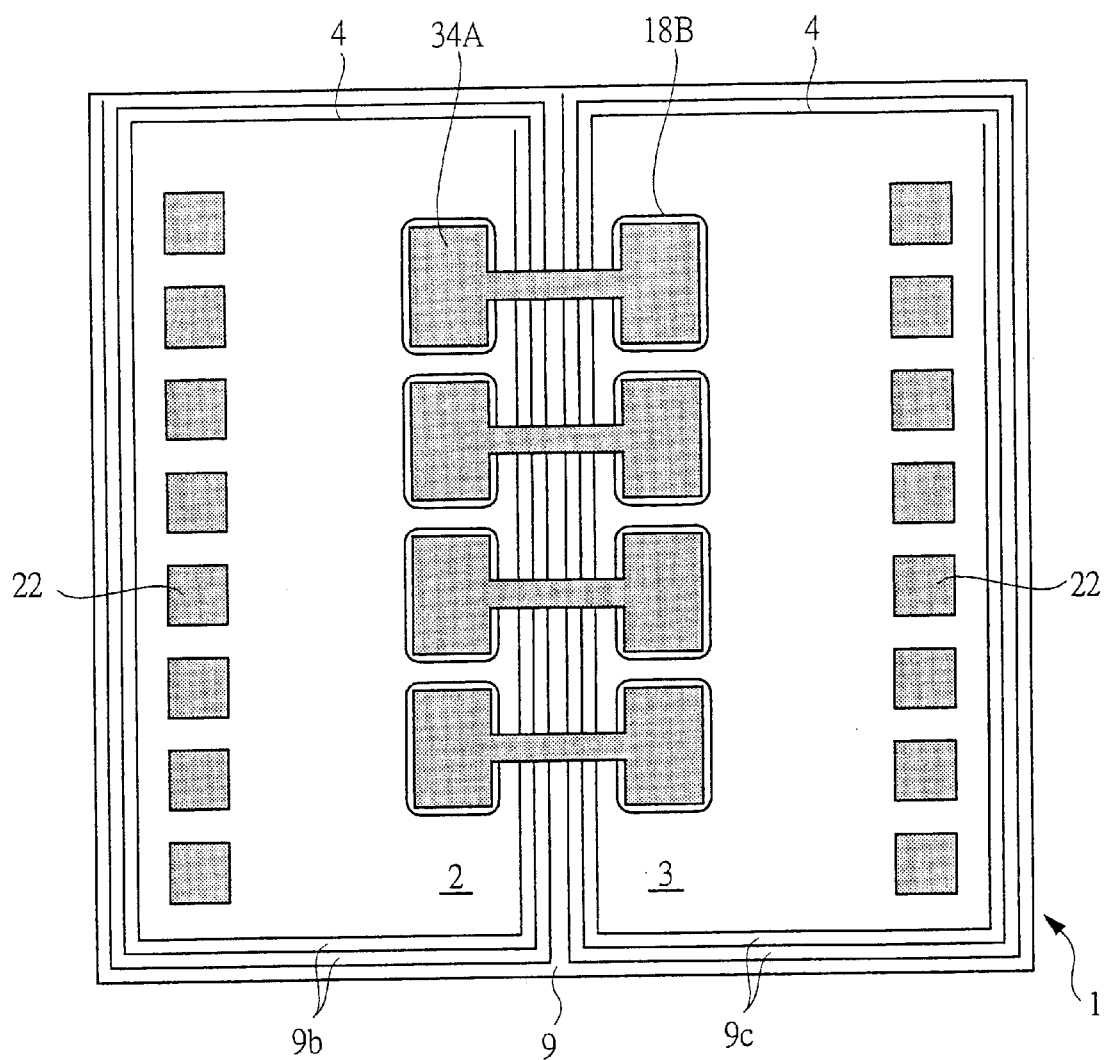
FIG. 27 is a top view of a principal part of a substrate showing a semiconductor integrated circuit device that is a twelfth embodiment of the present invention.

FIG. 27 is a top view of a principal part of a semiconductor integrated circuit region that is a twelfth embodiment of the present invention.

In the semiconductor integrated circuit device of the present embodiment, each of the circuit regions 2 and 3 is surrounded by a spiral insulating isolation trench 4. In FIG. 27, an insulating isolation trench having a length about 2.5 times longer than the circumference of each of the circuit regions 2 and 3 is formed in a spiral form. Each of the circuit regions 2 and 3 may also be surrounded by an insulating isolation trench having a length 2.5 times as long as or 2.5 times longer than the circumference thereof. As described above, in the case where each of the circuit regions 2 and 3 is surrounded by a spiral insulating isolation trench corresponding to a length seventeen times longer than the circumference thereof, a withstand voltage of 3000 V or more can be obtained.

In the semiconductor integrated circuit device of the present embodiment, therefore, the circuit region 2 and the intermediate region 9 are connected by the spiral diffused resistor (9b).

Furthermore, the circuit region 3 and the intermediate region 9 are connected by the spiral diffused resistor (9c).

Therefore, the isolating region 9b having a length a little twice longer than the circumference of the nearly rectangle-shaped circuit region 2 can be utilized as a diffused resistor. Furthermore, the isolating region 9c having a length a little twice longer than the circumference of the nearly rectangle-shaped circuit region 2 can be utilized as a diffused resistor. The remaining constitution is similar to the case of the seventh embodiment, and thereby description thereof will be omitted.

According to the present embodiment, the diffused resistors are thus connected between the circuit region 2 and the intermediate region 9 and between the circuit region 3 and the intermediate region 9, respectively. Therefore, since the voltage as described in detail in the second embodiment is distributed by the diffused resistors, each voltage applied to the insulating isolation trenches can be made uniform, and thereby the withstand voltage can be increased. Furthermore, since it is unnecessary to form wirings and connection portions, the diffused resistors can be formed in a easy process. In addition, the degree of integration of elements can be improved and the chip area thereof can be reduced. In addition, since the diffused resistor is formed in a spiral shape, diffused resistor thereof can be increased easily.

Thirteenth Embodiment

Figure 28:
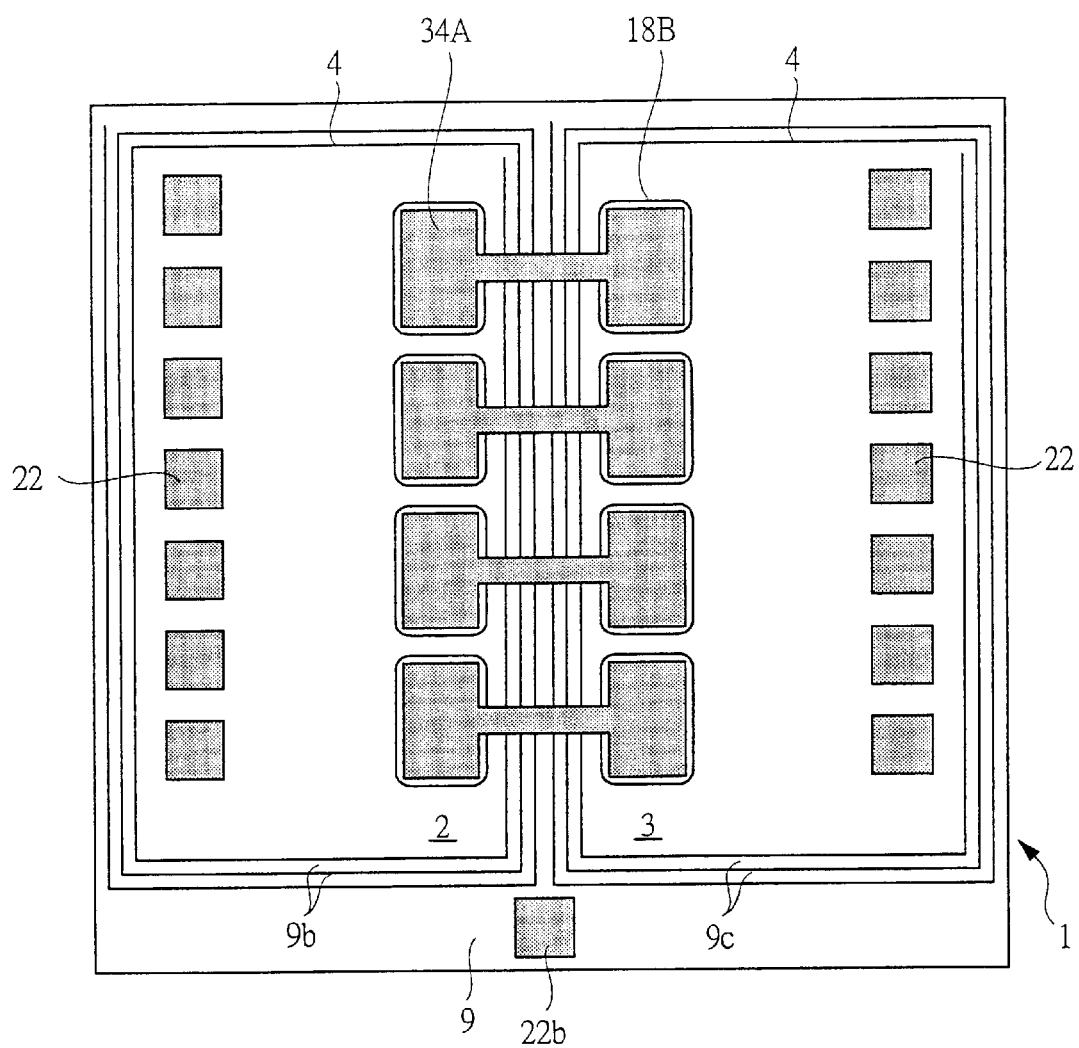
FIG. 28 is a top view of a principal part of a substrate showing a semiconductor integrated circuit device that is a thirteenth embodiment of the present invention.

FIG. 28 is a top view of a principal part of a semiconductor integrated circuit device that is a thirteenth embodiment of the present invention.

In the semiconductor integrated circuit device of the present embodiment, similarly to the case of the twelfth embodiment, each of the circuit regions 2,3 is surrounded by a spiral insulating isolation trench 4. In addition, a bonding pad portion 22b is formed on the intermediate region 9. Similarly to the case of the fourth embodiment, this bonding pad portion 22b is connected to a die pad on which an SOI substrate 1 is mounted. The remaining constitution is similar to the case of the seventh embodiment, and thereby description thereof will be omitted.

According to the present embodiment, in addition to effects obtained by the twelfth embodiment, the intermediate region 9 is connected to the die pad. Therefore, similarly to the fourth embodiment, the supporting layer 1a in the SOI substrate 1, in addition to the circuit region 2, the isolating region 9b, the intermediate region 9, the isolating region 9c and the circuit region 3, also arranges at the floating state, and it is thereby possible to prevent electric charge such as surge or the like from being stored in the supporting layer 1a.

Fourteenth Embodiment

If any of the first to thirteenth embodiments is used in a modem circuit connected between a communication line and a terminal device, signals can be transmitted while the communication line is insulated and isolated from the terminal device. This modem circuit modulates and demodulates signals transmitted between the communication line and the terminal device. Furthermore, if any of the first to thirteenth embodiments is used in a medical measuring instrument, signals can be transmitted while being insulated and isolated between a sensor section and a signal processing section included in the medical measuring instrument.

Figure 29:
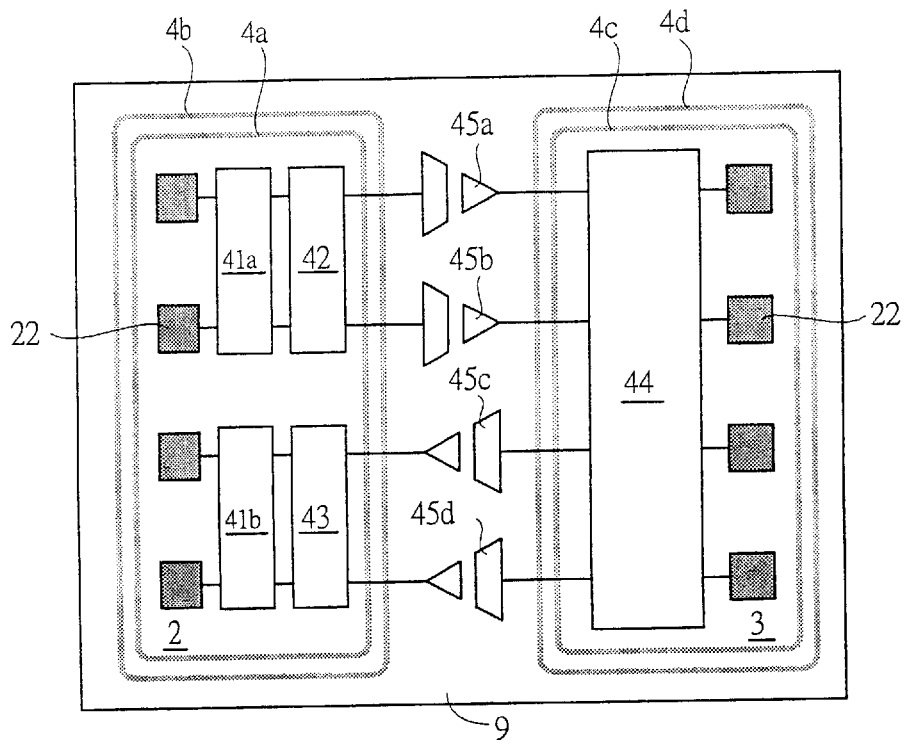
FIG. 29 is a top view of a principal part of a substrate showing a semiconductor integrated circuit device that is a fourteenth embodiment of the present invention.

FIG. 29 is a top view of a principal part of a semiconductor integrated circuit device that applies any of the first to thirteenth embodiments to an analog front end LSI for modem.

In this case, filter amplifier circuits 41a and 41b each having a filter circuit and an amplifier circuit, an A/D (Analog-to-Digital) converter circuit 42, and a D/A (Digital-to-Analog) converter circuit 43 are formed on the circuit region 2 connected to a telephone line.

A digital filter circuit and a DSP (Digital Signal Processing) circuit 44 are formed on the circuit region 3 connected to a terminal circuit such as a personal computer or the like.

Furthermore, isolators 45a to 45d are formed between the circuit regions 2 and 3. Each of these isolators 45a to 45d is constituted by a capacitance element, a transmitting amplifier, and a receiving amplifier. It is possible to easily fabricate the isolators having such constitutions and thereby reduce the manufacturing costs thereof.

Since the respective circuit regions 2 and 3 are surrounded by insulating isolation trenches 4a to 4d, it is possible to apply to the first to thirteenth embodiments about a constitution having the above-mentioned insulating isolation films.

Thus, in the present embodiment, forming circuits required for signal transmission such as the A/D converter circuit 42, the D/A converter circuit 43, the DSP (Digital Signal Processor) circuit 44 and the like on the circuit regions 2 and 3, can achieve a compact size (one chip) of a communication device.

In the present embodiment, the present invention has been applied to a LSI for modem. Alternatively, the present invention can also be applied to a terminal device such as a personal computer. In this case, signals can be transmitted while being insulated and isolated between an internal circuit such as a logical operation circuit or the like included in the terminal device and a communication line.

Fifteenth Embodiment

Figure 30:
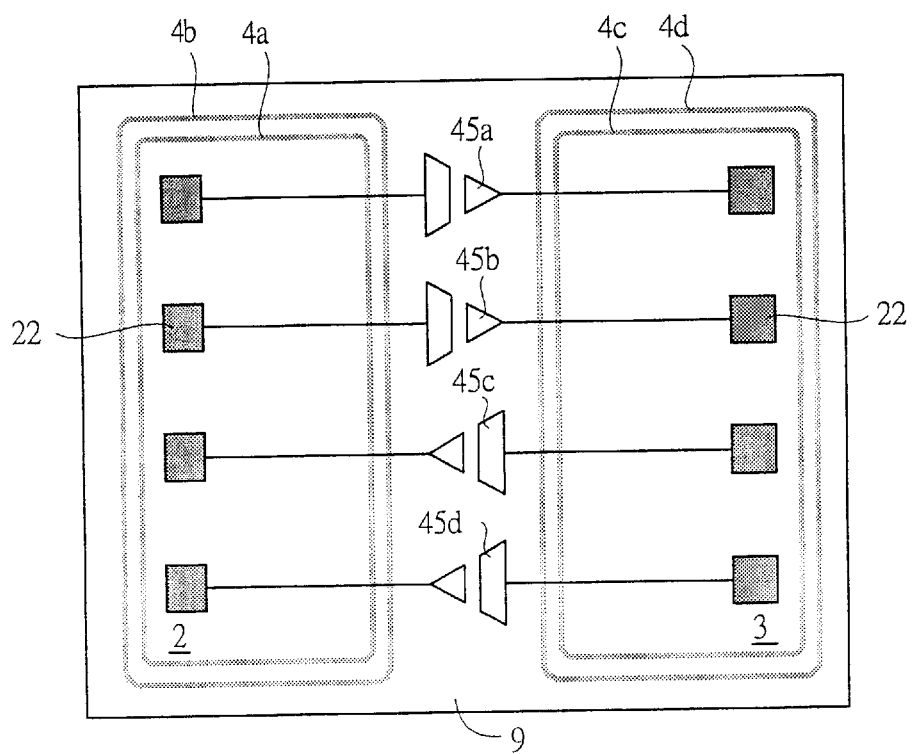
FIG. 30 is a top view of a principal part of a substrate showing a semiconductor integrated circuit device that is a fifteenth embodiment of the present invention.

In the fourteenth embodiment, the circuits required for signal transmission such as the A/D converter circuit 42, the D/A converter circuit 43, the DSP circuit 44 and the like are formed on the SOI substrate. Alternatively, only the isolators 45a to 45d may be formed on the SOI substrate, as shown in FIG. 30.

Thus, in the present embodiment, a plurality of isolators 45a to 45d can be formed on the same SOI substrate 1. Therefore, for example, in comparison with the case where an isolator similar to an isolator using photodiode or the like is formed as another part, it is possible to achieve a high integrated size and reduction of the manufacturing costs thereof. In addition, it is possible to reduce the number of components of the device and achieve a compacted size of the device.

Sixteenth Embodiment

Next, manufacturing methods of the semiconductor integrated circuit devices according to the first to thirteenth embodiments will be described. Since these manufacturing methods are similar, manufacturing methods of the semiconductor integrated circuit devices shown in FIG. 10 (the second embodiment) and FIG. 24 (the ninth embodiment) will be described, and the manufacturing methods of the other semiconductor integrated circuit devices will be omitted.

FIGS. 31A to 31C and FIGS. 32A and 32B are cross-sectional views of substrates for showing a manufacturing method of the semiconductor integrated circuit device of FIG. 10 described in the second embodiment.

Figure 31A:
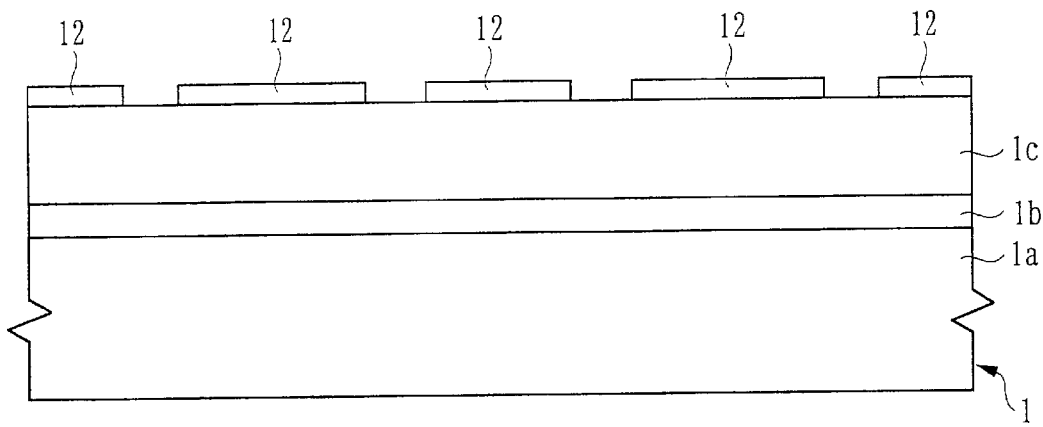
FIG. 31A is a cross-sectional view of a principal part of a substrate for showing a manufacturing method of a semiconductor integrated circuit device according to the present invention.

As shown in FIG. 31A, a silicon nitride film (not illustrated) is deposited on the SOI substrate 1 comprising the supporting layer 1a, the insulating layer 1b, and the semiconductor region 1c formed of monocrystalline silicon or the like. The silicon nitride film is patterned. Thereafter, by using the silicon nitride film as a mask and performing thermal oxidation on the semiconductor region 1c, each field oxide film 12 is formed.

Figure 31B:
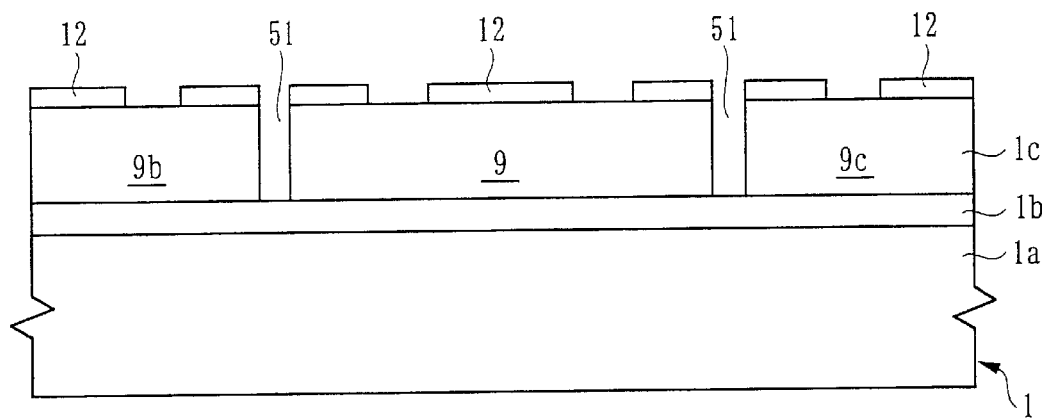
FIG. 31B is a cross-sectional view of a principal part of a substrate for showing a manufacturing method of a semiconductor integrated circuit device according to the present invention.

Subsequently, as shown in FIG. 31B, by using, as a mask, a resist film (not illustrated) formed on the field oxide films 12, and anisotropically etching the field oxide films 12 and the semiconductor region 1c, isolation grooves 51 arriving at the insulating layer 1b are formed.

Figure 31C:
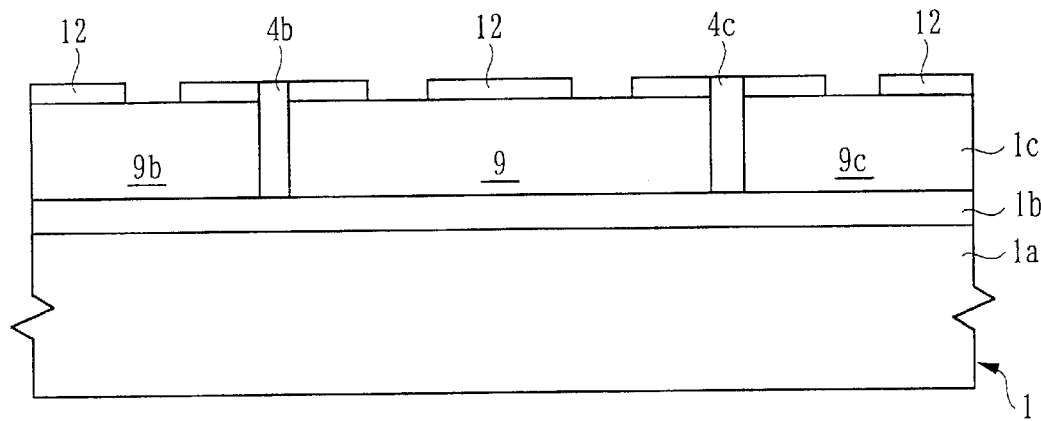
FIG. 31C is a cross-sectional view of a principal part of a substrate for showing a manufacturing method of a semiconductor integrated circuit device according to the present invention.

Subsequently, as shown in FIG. 31C, a silicon oxide film 4 is deposited on the semiconductor region 1c including the inside of the isolation grooves 51. At this time, the silicon oxide film 4 is deposited until having a film thickness enough to fill the inside of the isolation grooves. Thereafter, the surface of the silicon oxide film 4 is polished by using chemical mechanical polishing (CMP) method or etched, until the surface of the field oxide film 12 is exposed.

In the process heretofore described, a silicon oxide film is embedded in each isolation groove, and thereby insulating isolation trenches 4b and 4c are completed.

Figure 32A:
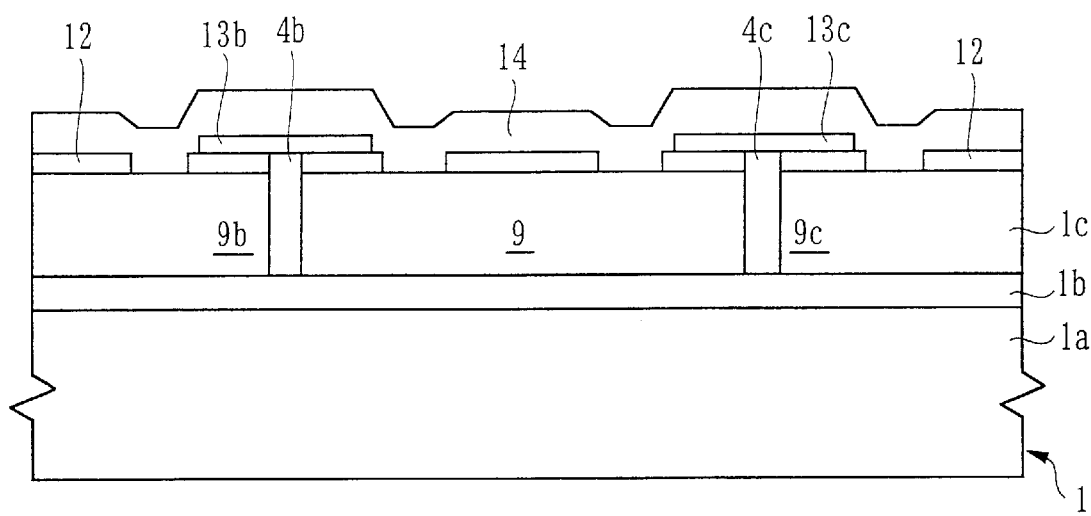
FIG. 32A is a cross-sectional view of a principal part of a substrate for showing a manufacturing method of a semiconductor integrated circuit device according to the present invention.

Subsequently, as shown in FIG. 32A, a semiconductor film made of polycrstalline silicon or the like is deposited on the SOI substrate 1 and then patterned. Thereby, wiring resistors 13b and 13c are formed on the insulating isolation trenches 4b and 4c, respectively. Next, by depositing an insulation film such as a silicon oxide film or the like, an interlayer insulating film 14 is formed.

Figure 32B:
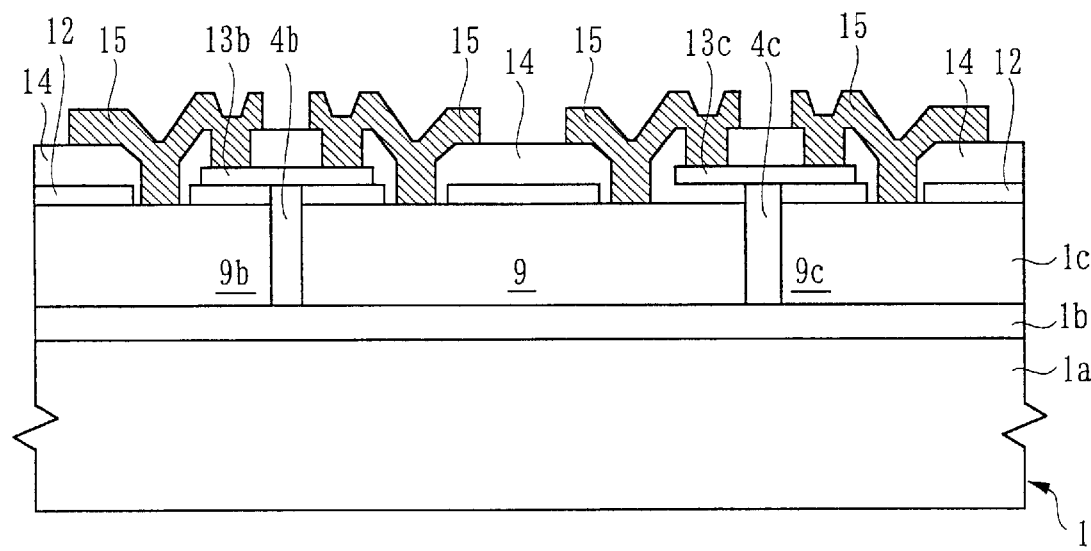
FIG. 32B is a cross-sectional view of a principal part of a substrate for showing a manufacturing method of a semiconductor integrated circuit device according to the present invention.

Subsequently, as shown in FIG. 32B, contact holes are formed on the wiring resistors 13b and 13c, the isolating regions 9b and 9c, and the intermediate region. Next, a conductive film made of aluminum or the like is deposited on the SOI substrate 1 and patterned. Thereby, the first layer wirings 15 are formed for connecting the wiring resistors 13b and 13c to the isolating regions 9b and 9c, and for connecting the wiring resistors 13b and 13c to the intermediate region 9.

Next, manufacturing of the semiconductor integrated circuit device having the wide insulating isolation trench shown in FIG. 24 (the ninth embodiment) will be described.

FIGS. 33A to 33C and FIGS. 34A and 34B are cross-sectional views of a substrate for showing a manufacturing method of the semiconductor integrated circuit device of FIG. 24 described in the ninth embodiment. FIGS. 33A to 33C and FIGS. 34A and 34B correspond to cross-sectional views taken along lines A-B and C-D of FIG. 24, respectively.

Figure 33A:
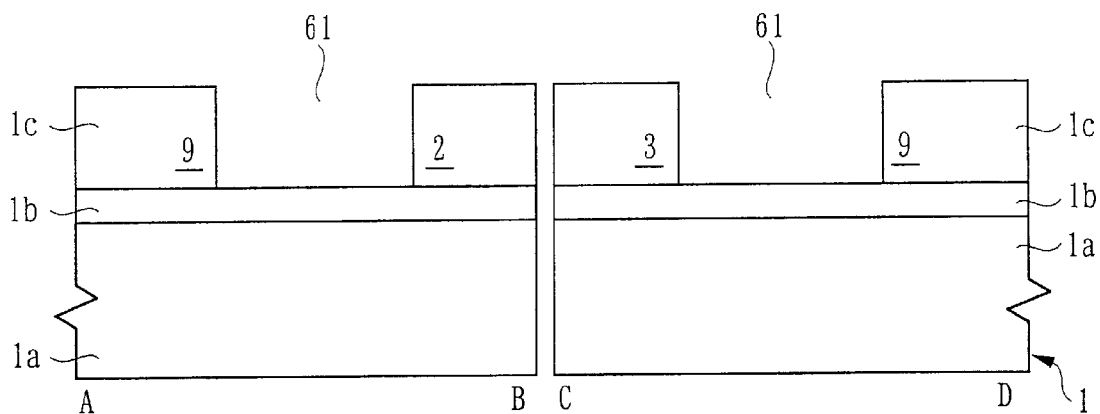
FIG. 33A is a cross-sectional view of a principal part of a substrate for showing a manufacturing method of a semiconductor integrated circuit device according to the present invention.

As shown in FIG. 33A, both a resist film (not illustrated) formed on an SOI substrate 1 comprising the supporting layer 1a, the insulating layer 1b and the semiconductor region 1c formed of monocrystalline silicon or the like, and the semiconductor region 1c are anisotropically etched. Thereby, wide isolation grooves 61 arriving at the insulating layer 1b are formed.

Figure 33B:
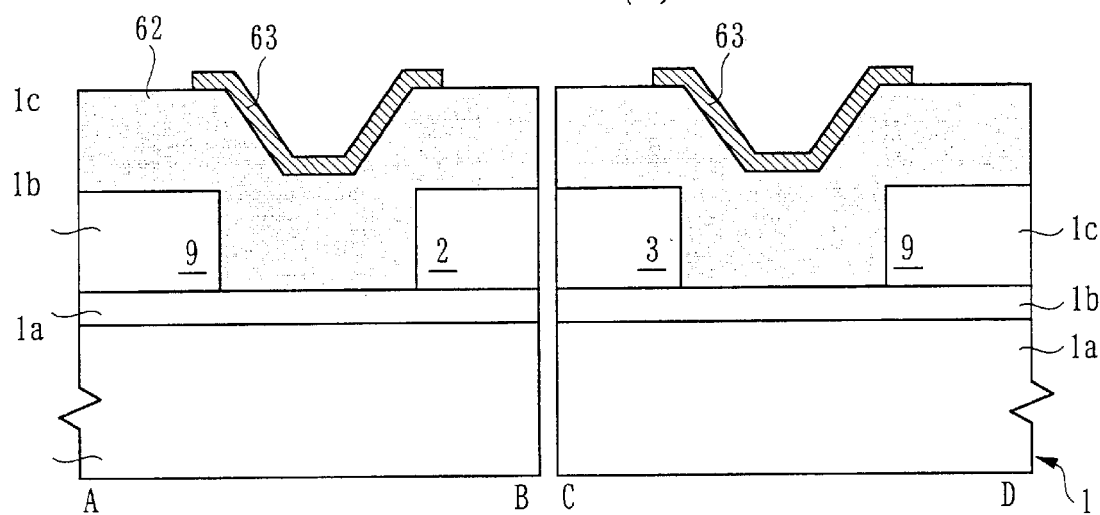
FIG. 33B is a cross-sectional view of a principal part of a substrate for showing a manufacturing method of a semiconductor integrated circuit device according to the present invention.

Subsequently, as shown in FIG. 33B, a silicon oxide film 62 is deposited on the semiconductor region 1c including the inside of each wide isolation groove 61. At this time, the silicon oxide film 62 is deposited so as to be sufficiently filled in each wide isolation groove 61. Thereafter, a CMP stopper film 63 is formed only on each wide isolation groove 61. The CMP stopper film 63 functions as prevention of the silicon oxide film 62 filled in each wide isolation groove 61 from being polished deeper than the surface of the SOI substrate 1.

Figure 33C:
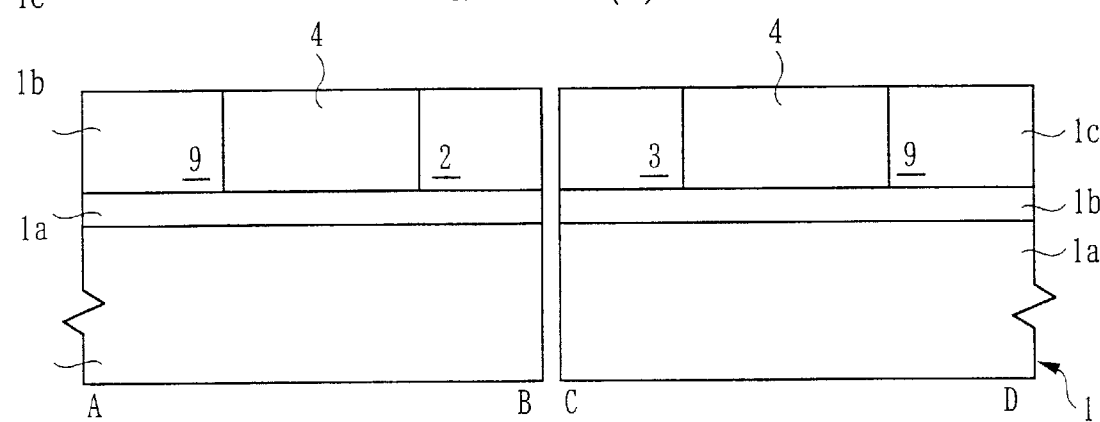
FIG. 33C is a cross-sectional view of a principal part of a substrate for showing a manufacturing method of a semiconductor integrated circuit device according to the present invention.

Subsequently, as shown in FIG. 33C, the silicon oxide film 62 is polished by using the CMP method until the surface of the SOI substrate 1 is exposed, and then each CMP stopper film 63 is removed.

Figure 34A:
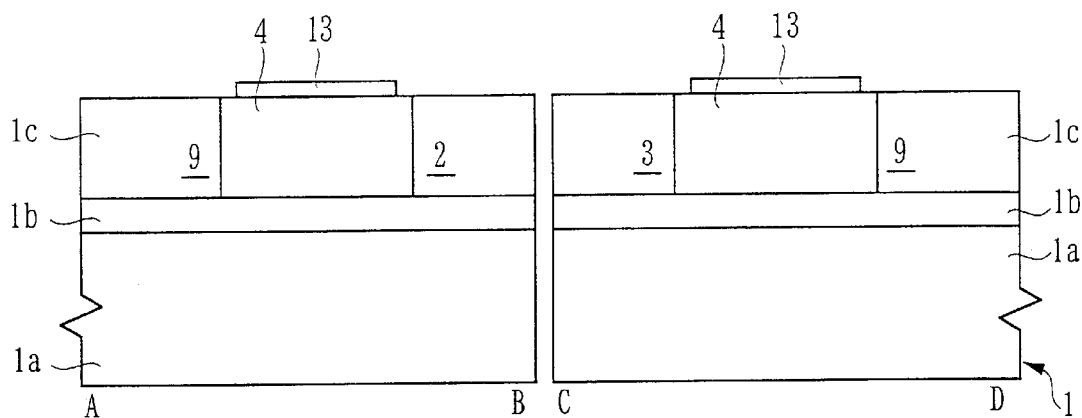
FIG. 34A is a cross-sectional view of a principal part of a substrate for showing a manufacturing method of a semiconductor integrated circuit device according to the present invention.

Subsequently, as shown in FIG. 34A, a semiconductor film formed of polycrystalline silicon or the like is deposited on the SOI substrate 1 and then patterned. Thereby, wiring resistors 13 are formed on the wide insulating isolation trenches 4.

Figure 34B:
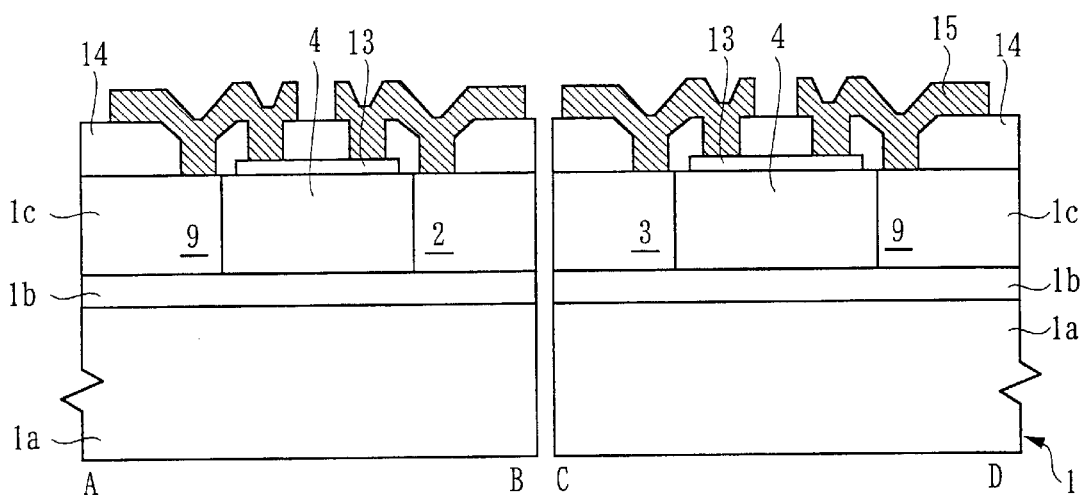
FIG. 34B is a cross-sectional view of a principal part of a substrate for showing a manufacturing method of a semiconductor integrated circuit device according to the present invention.

Subsequently, as shown in FIG. 34B, an interlayer insulating film 14 is formed by depositing an insulating film such as a silicon oxide film or the like. Subsequently, contact holes are formed on the wiring resistors 13, the circuit regions 2 and 3, and the intermediate region 9. Next, a conductive film made of aluminum or the like is deposited on the SOI substrate 1 and patterned. Thereby, first layer wirings 15 for connecting the wiring resistor 13 to the circuit regions 2 and 3, and for connecting the wiring resistor 13 to the intermediate region 9 are formed, respectively.

As mentioned above, inventions made by the present inventors have been described concretely in accordance with the embodiments. However, the present invention is not limited to the above-described embodiments, and, needless to say, various modifications can be made without departing from the gist of the invention.

Of the inventions disclosed by the present application, effects obtained by several representative inventions will be described as follows.

In the semiconductor integrated circuit device of the present invention, the first circuit region on the main surface of the SOI substrate, and the first isolating region defined by said first and second insulating isolation trenches are connected by a wiring resistor, or a diffused resistor in the SOI substrate. The first isolating region and the intermediate region extending between said second and fourth insulating isolation trenches are connected by a wiring resistor, or a diffused resistor in the SOI substrate. Furthermore, the second circuit region on the main surface of the SOI substrate, and the second isolating region defined by said third and fourth insulating isolation trenches are connected by a wiring resistor, or a diffused resistor in the SOI substrate. The second isolating region and the intermediate region are connected by a wiring resistor, or a diffused resistor in the SOI substrate. Therefore, since the voltage generated by the wiring resistors or the diffused resistors is distributed, the voltages applied to the insulating isolation trenches can be made uniform, and thereby the withstand voltage of the circuit regions 2 and 3 can be increased.

Furthermore, since the first and second circuit regions are surrounded by wide insulating isolation trenches, the withstand voltage of the circuit regions 2 and 3 can be increased.

Furthermore, since the first and second circuit regions are connected via each capacitance element C, it is possible to transmit only electric signals during maintenance of the insulation state of the first circuit region and the second circuit region.

In the manufacturing method of the semiconductor integrated circuit device according to the present invention, the semiconductor region constituting the SOI substrate is etched until the insulating layer is exposed, and thereby isolation grooves surrounding the first and second circuit regions on the semiconductor region are formed. A silicon oxide film is embedded in the isolation grooves, and thereby the insulating isolation trenches are formed, and wiring resistors are formed on the insulating isolation trenches, and furthermore the wiring is formed for connecting the first circuit region and the second circuit region via the wiring resistors. As a result, it is possible to form the semiconductor integrated circuit device having a high withstand voltage.

What is claimed is:

1. A semiconductor integrated circuit device having a first and second circuit regions on a main surface of an SOI substrate, said SOI substrate including a supporting layer, an insulating layer formed on said supporting layer, and a semiconductor region formed on said insulating layer, said semiconductor integrated circuit device comprising:

(a) a first insulating isolation trench surrounding said first circuit region and arriving at said insulating layer, and a second insulating isolation trench surrounding said first insulating isolation trench and arriving at said insulating layer;

(b) a third insulating isolation trench surrounding said second circuit region and arriving at said insulating layer, and a fourth insulating isolation trench surrounding said third insulating isolation trench and arriving at said insulating layer;

(c) an intermediate region extending between said second and fourth insulating isolation trenches;

(d) a first wiring resistor for connecting said first circuit region and a first isolating region which is defined by said first and second insulating isolation trenches, and a second wiring resistor for connecting said first isolating region and said intermediate region: and (e) a third wiring resistor for connecting said second circuit region and a second isolating region which is defined by said third and fourth insulating isolation trenches, and a fourth wiring resistor for connecting said second isolating region and said intermediate region.

2. The semiconductor integrated circuit device according to claim 1, wherein each of said first to fourth wiring resistors has a resistance value of $4 \times 10^6$ to $4 \times 10^7 \Omega$.

3. The semiconductor integrated circuit device according to claim 1, wherein the number of insulating isolation trenches surrounding each of said first and second circuit regions is fifteen or more.

4. The semiconductor integrated circuit device according to claim 1, wherein said first and second wiring resistors are formed along said first insulating isolation trench, and said third and fourth wiring resistors are formed along said third insulating isolation trench.

5. The semiconductor integrated circuit device according to claim 1, wherein each of said first and second circuit regions is a nearly rectangle-shaped region, and said first and second wiring resistors are formed along a long side of said nearly rectangle-shaped region, and said third and fourth wiring resistors are formed along a long side of said nearly rectangle-shaped region.

6. The semiconductor integrated circuit device according to claim 1, wherein said SOI substrate is provided on a die pad, and said intermediate region is electrically connected to said die pad.

7. The semiconductor integrated circuit device according to claim 1, wherein said first and second circuit regions are connected to each other via a capacitance element.

8. The semiconductor integrated circuit device according to claim 7, wherein said capacitance element is formed on said intermediate region.

9. The semiconductor integrated circuit device according to claim 7, wherein said capacitance element comprises said intermediate region, an insulating film formed on said intermediate region, and an upper electrode formed on said insulating film.

10. The semiconductor integrated circuit device according to claim 7, wherein said capacitance element comprises a lower electrode formed on said intermediate region, an insulating film formed on said lower electrode, and an upper electrode formed on said insulating film.

11. The semiconductor integrated circuit device according to claim 7, wherein said capacitance element constitutes an isolator circuit for performing one of signal transmission from said first circuit region to said second circuit region and signal transmission from said second circuit region to said first circuit region.

12. The semiconductor integrated circuit device according to claim 1, wherein said first and second circuit regions are connected via an isolator comprising a capacitance element; an amplifier circuit, a filter circuit, an A/D conversion circuit, and a D/A conversion circuit are formed in said first circuit region; and a digital filter circuit and a DSP circuit are formed in said second circuit region.

13. A semiconductor integrated circuit device having a first and second circuit regions on a main surface of an SOI substrate, said SOI substrate including a supporting layer, an insulating layer formed on said supporting layer, and a semiconductor region formed on said insulating layer, said semiconductor integrated circuit device comprising:

(a) a first wide insulating isolation trench surrounding said first circuit region and arriving at said insulating layer;

(b) a second wide insulating isolation trench surrounding said second circuit region and arriving at said insulating layer;

(c) an intermediate region extending between said first and second wide insulating isolation trenches;

(d) a first wiring resistor for connecting said first circuit region and said intermediate region; and (e) a second wiring resistor for connecting said second circuit region and said intermediate region.

14. The semiconductor integrated circuit device according to claim 13, wherein each of said first and second wide insulating isolation trenches has a width of 0.4 $\mu$m or more.

15. The semiconductor integrated circuit device according to claim 13, wherein said first wiring resistor is formed along said first wide insulating isolation trench, and said second wiring resistor is formed along said second wide insulating isolation trench.

16. A semiconductor integrated circuit device having a first and second circuit regions on a main surface of an SOI substrate, said SOI substrate including a supporting layer, an insulating layer formed on said supporting layer, and a semiconductor region formed on said insulating layer, said semiconductor integrated circuit device comprising:

(a) a first insulating isolation trench surrounding said first circuit region and arriving at said insulating layer, and a second insulating isolation trench surrounding said first insulating isolation trench and arriving at said insulating layer;

(b) a third insulating isolation trench surrounding said second circuit region and arriving at said insulating layer, and a fourth insulating isolation trench surrounding said third insulating isolation trench and arriving at said insulating layer;

(c) an intermediate region extending between said second and fourth insulating isolation trenches;

(d) a first wiring for connecting said first circuit region and a first isolating region which is defined by said first and second insulating isolation trenches, and a second wiring for connecting said first isolating region and said intermediate region; and (e) a third wiring for connecting said second circuit region and a second isolating region which is defined by said third and fourth insulating isolation trenches, and a fourth wiring for connecting said second isolating region and said intermediate region.

17. The semiconductor integrated circuit device according to claim 16, wherein each diffused resistor of a first insulating region and a second insulating region has a resistance value of $4 \times 10^6$ to $4 \times 10^7 \Omega$, said first insulating region being connected between said first and second wirings and defined by said first circuit region and said first and second insulating isolation trenches, said second region being connected between said third and fourth wirings and defined by said second circuit region and said third and fourth insulating isolation trenches.

18. The semiconductor integrated circuit device according to claim 16,
wherein each of said first and second circuit regions is a nearly rectangle-shaped region;
said first wiring is formed near one end of a long side of the nearly rectangle-shaped region in said first circuit region;
said second wiring is formed near the other end of the long side of the nearly rectangle-shaped region in said first circuit region;
said third wiring is formed near one end of a long side of the nearly rectangle-shaped region in said second circuit region, and
said fourth wiring is formed near the other end of the long side of the nearly rectangle-shaped region in said second circuit region.

19. The semiconductor integrated circuit device according to claim 16,
wherein said SOI substrate is provided on a die pad, and said intermediate region is electrically connected to said die pad.

20. The semiconductor integrated circuit device according to claim 16,
wherein said first and second circuit regions are connected to each other via a capacitance element.

21. The semiconductor integrated circuit device according to claim 20,
wherein said capacitance element is formed on said intermediate region.

22. The semiconductor integrated circuit device according to claim 20,
wherein said capacitance element comprises said intermediate region, an insulating film formed on said intermediate region, and an upper electrode formed on said insulating film.

23. The semiconductor integrated circuit device according to claim 20,
wherein said capacitance element comprises a lower electrode formed on said intermediate region, an insulating film formed on said lower electrode, and an upper electrode formed on said insulating film.

24. The semiconductor integrated circuit device according to claim 16,
wherein said capacitance element constitutes an isolator circuit for performing one of signal transmission from said first circuit region to said second circuit region and signal transmission from said second circuit region to said first circuit region.

25. The semiconductor integrated circuit device according to claim 16,
wherein said first and second circuit regions are connected via an isolator comprising a capacitance element,
an amplifier circuit, a filter circuit, an A/D conversion circuit, and a D/A conversion circuit are formed on said first circuit region, and
a digital filter circuit and a DSP circuit are formed on said second circuit region.

26. A semiconductor integrated circuit device having a first and second circuit regions on a main surface of an SOI substrate, said SOI substrate including a supporting layer, an insulating layer formed on said supporting layer, and a semiconductor region formed on said insulating layer, said semiconductor integrated circuit device comprising:
(a) a first insulating isolation trench surrounding said first circuit region and arriving at said insulating layer, and a second insulating isolation trench surrounding said first insulating isolation trench and arriving at said insulating layer;
(b) a third insulating isolation trench surrounding said second circuit region and arriving at said insulating layer, and a fourth insulating isolation trench surrounding said third insulating isolation trench and arriving at said insulating layer;
(c) an intermediate region extending between said second and fourth insulating isolation trenches;
(d) a first connecting portion for connecting said first circuit region and a first isolating region which is defined by said first and second insulating isolation trenches, and a second connecting portion for connecting said first isolating region and said intermediate region; and
(e) a third connecting portion for connecting said second circuit region and a second isolating region which is defined by said third and fourth insulating isolation trenches, and a fourth connecting portion for connecting said second isolating region and said intermediate region.

27. The semiconductor integrated circuit device according to claim 26,
wherein each of said first and second connecting portions is constituted by a shortcircuit region where said first and second insulating isolation trenches are not formed, and
each of said third and fourth connecting portions is constituted by a shortcircuit region where said third and fourth insulating isolation trenches are not formed.

28. A semiconductor integrated circuit device having a first and second circuit regions on a main surface of an SOI substrate, said SOI substrate including a supporting layer, an insulating layer formed on said supporting layer, and a semiconductor region formed on said insulating layer, said semiconductor integrated circuit device comprising:
(a) a first insulating isolation trench surrounding said first circuit region in a spiral form and arriving at said insulating layer; and
(b) a second insulating isolation trench surrounding said second circuit region in a spiral form and arriving at said insulating layer.

29. A semiconductor integrated circuit device having a first and second circuit regions on a main surface of an SOI substrate, said SOI substrate including a supporting layer, an insulating layer formed on said supporting layer, and a semiconductor region formed on said insulating layer, said semiconductor integrated circuit device comprising:
(a) a plurality of insulating isolation trenches surrounding said first circuit region and arriving at said insulating layer;
(b) a plurality of insulating isolation trenches surrounding said second circuit region and arriving at said insulating layer;
(c) an intermediate region extending between an outermost insulating isolation trench among said plurality of insulating isolation trenches surrounding said first circuit region and an outermost insulating isolation trench among said plurality of insulating isolation trenches surrounding said second circuit region;
(d) a resistor element connected between said first circuit region and said intermediate region in parallel with said plurality of insulating isolation trenches; and
(e) a resistor element connected between said second circuit region and said intermediate region in parallel with said plurality of insulating isolation trenches.

* * * * *